(12) United States Patent
Sugaya et al.

(10) Patent No.: US 11,906,884 B2
(45) Date of Patent: Feb. 20, 2024

(54) ELECTRONIC APPARATUS

(71) Applicant: CANON KABUSHIKI KAISHA, Tokyo (JP)

(72) Inventors: Kazuki Sugaya, Tokyo (JP); Yohei Yamada, Tokyo (JP); Keisuke Fukuyo, Tokyo (JP); Takashi Yoshida, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 51 days.

(21) Appl. No.: 17/670,073

(22) Filed: Feb. 11, 2022

(65) Prior Publication Data

US 2022/0269152 A1 Aug. 25, 2022

(30) Foreign Application Priority Data

Feb. 19, 2021 (JP) ................................. 2021-025382

(51) Int. Cl.
*G03B 17/56* (2021.01)
*H05K 5/00* (2006.01)
*G03B 13/02* (2021.01)

(52) U.S. Cl.
CPC ........... *G03B 17/563* (2013.01); *G03B 13/02* (2013.01); *H05K 5/0086* (2013.01)

(58) Field of Classification Search
CPC .... G06F 1/1652; G06F 1/1616; G06F 1/1641; G06F 1/1647; G06F 1/1681; H04M 1/0216
See application file for complete search history.

(56) References Cited

U.S. PATENT DOCUMENTS

| 7,808,550 | B2 | 10/2010 | Misawa | |
|---|---|---|---|---|
| 11,190,629 | B1* | 11/2021 | Koh | ......................... G06F 3/041 |
| 2010/0041439 | A1* | 2/2010 | Bullister | .................. G06F 1/165 |
| | | | | 455/566 |
| 2015/0055286 | A1* | 2/2015 | Eguchi | ............... H10K 59/1213 |
| | | | | 361/679.26 |
| 2020/0401017 | A1* | 12/2020 | Yamazaki | ............ H04N 23/632 |
| 2022/0201108 | A1* | 6/2022 | Kim | ....................... G06F 3/0383 |

FOREIGN PATENT DOCUMENTS

JP 2005-354304 A 12/2005

\* cited by examiner

*Primary Examiner* — Noam Reisner
(74) *Attorney, Agent, or Firm* — Cowan, Liebowitz & Latman, P.C.

(57) ABSTRACT

In an electronic apparatus, a display at least partially has flexibility, includes a plurality of display portions, and includes a bending portion at each of boundaries of the display portions. An electronic apparatus includes, near each bending portion, a hinge portion that relatively rotatably couples two display portions and is configured to be bendable at each bending portion as a start point in response to rotation of each hinge portion. A main body coupling member rotatably couples the display to the main body portion. The display is able to transition to an accommodated state in which the display overlaps at a position that is different from the grip portion inside an outer shape of the main body portion and an unfolded state in which the plurality of display portions are unfolded in a parallel and same direction.

18 Claims, 22 Drawing Sheets

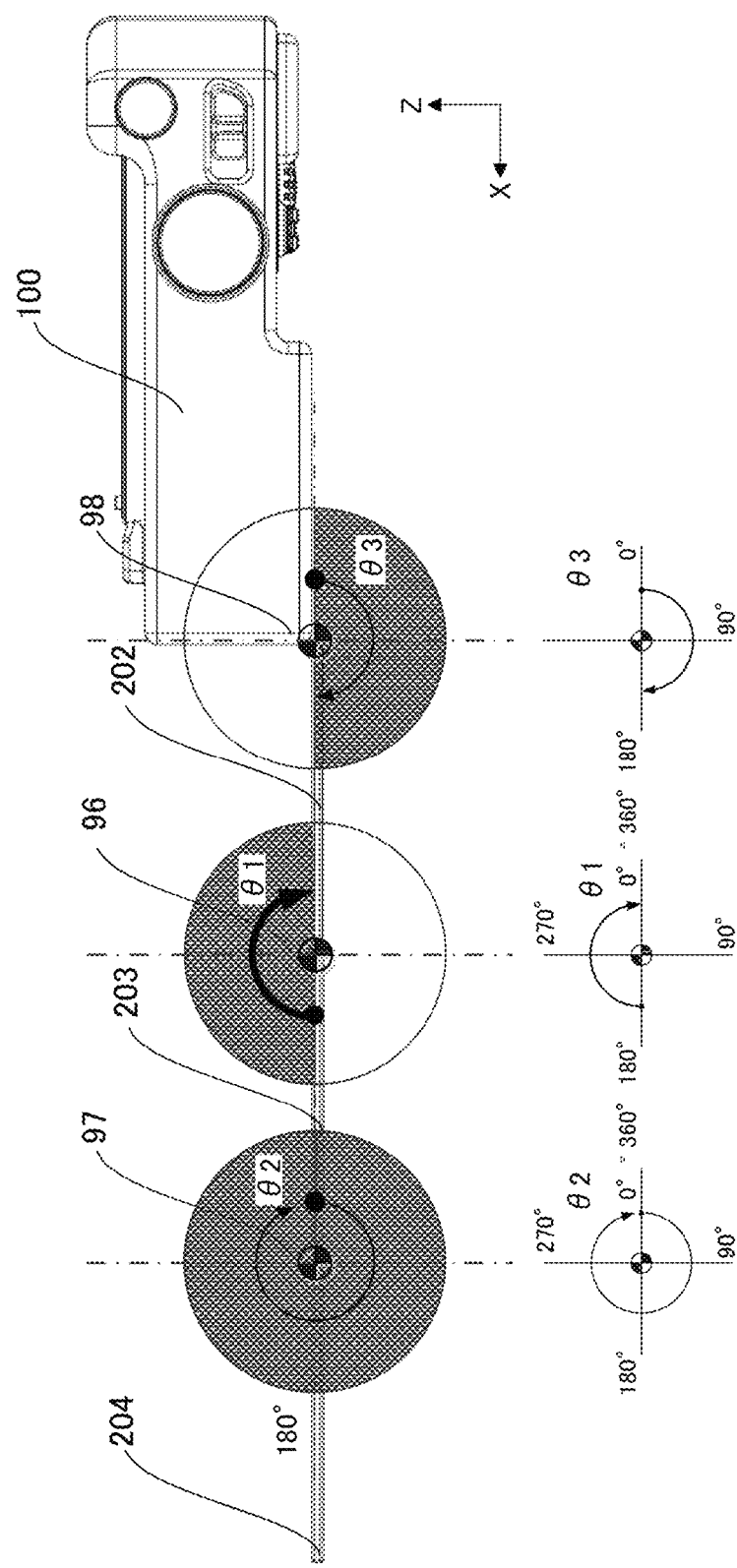

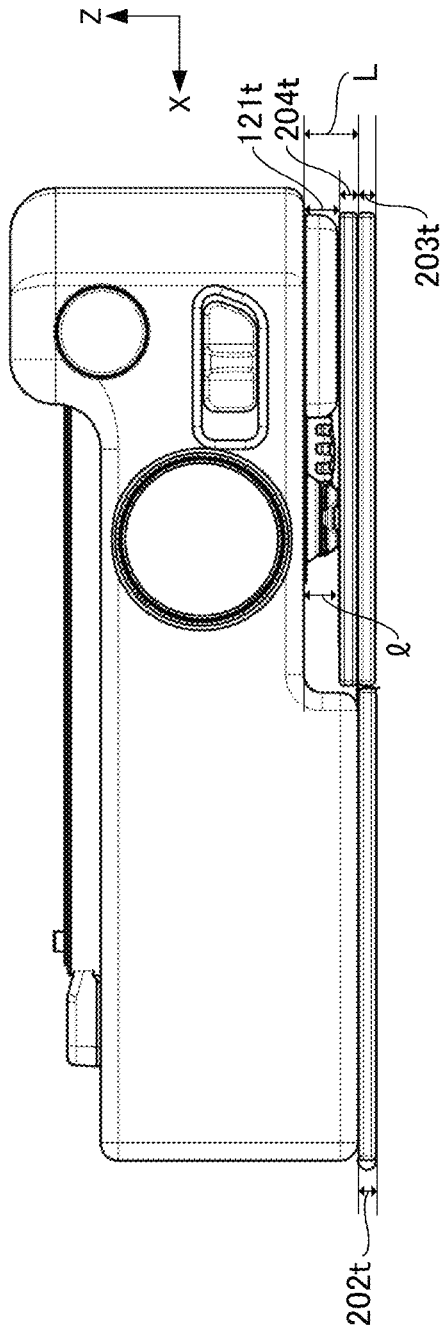
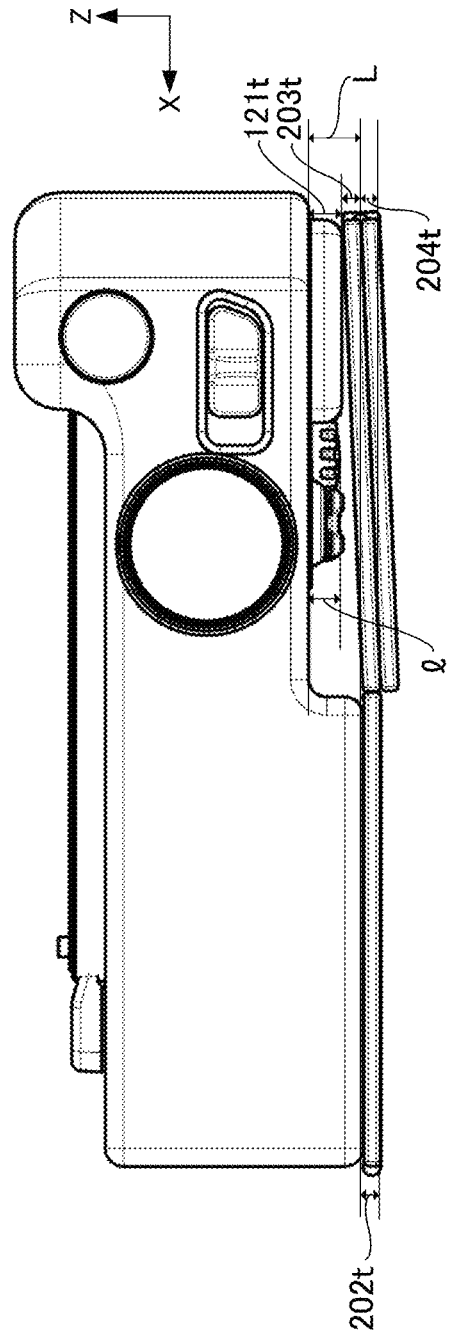
FIG. 8A
FIG. 8B

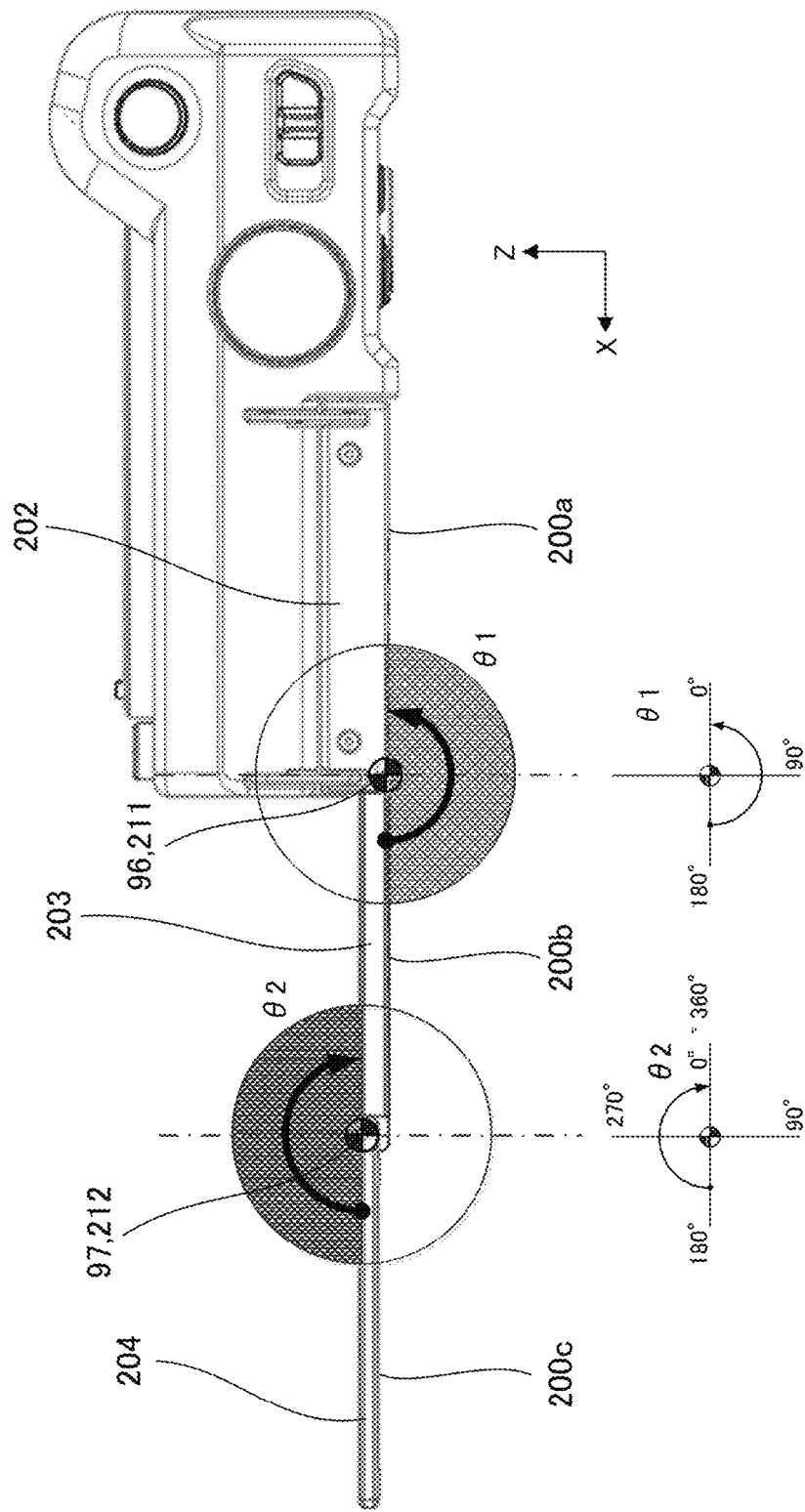

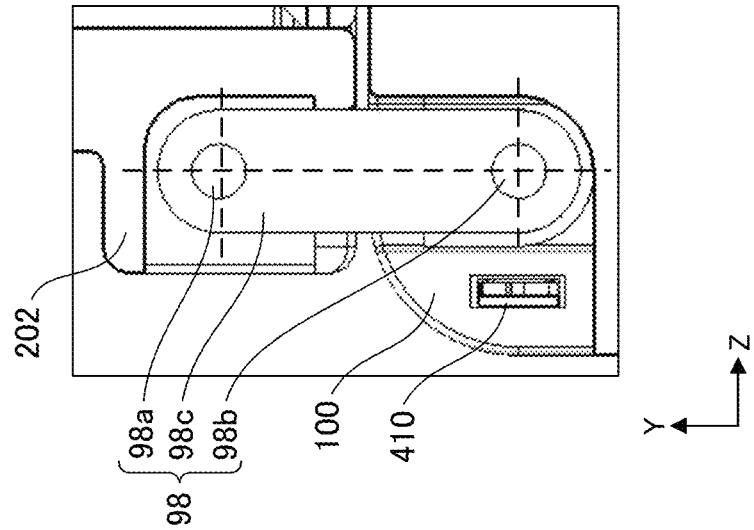
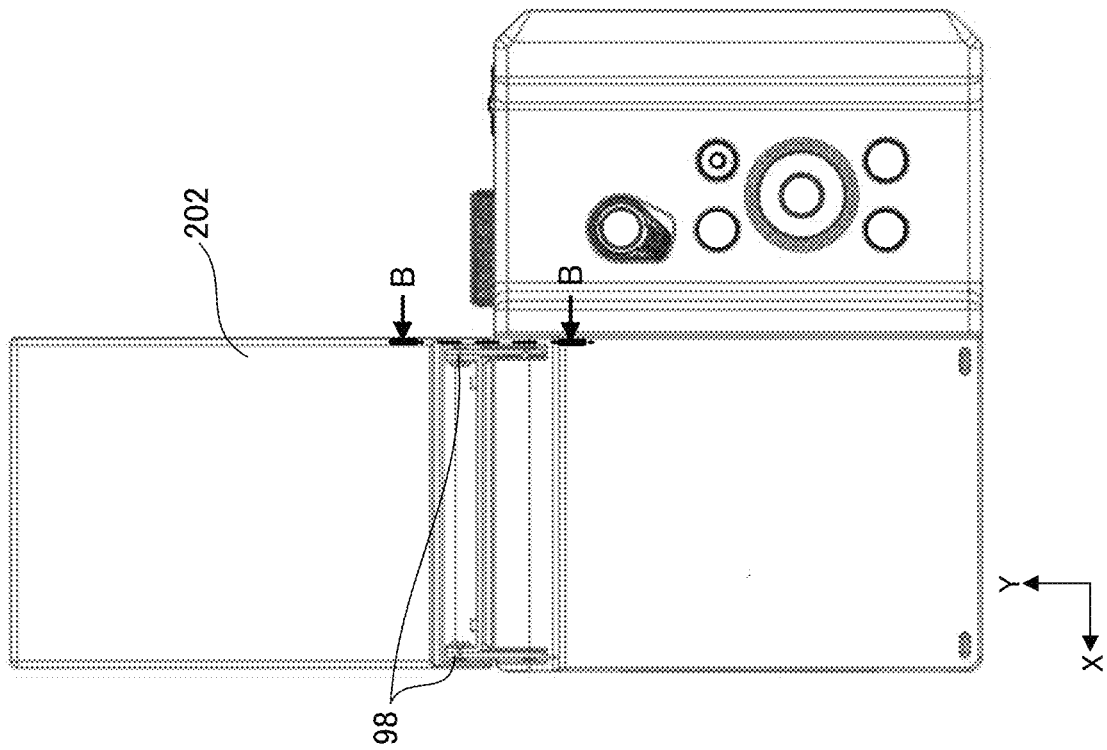

200c 200b   200a

ELECTRONIC APPARATUS

BACKGROUND OF THE INVENTION

Field of the Invention

The present invention relates to an electronic apparatus including a bendable display device.

Description of the Related Art

Electronic apparatuses such as digital cameras and smartphones include liquid crystal displays that have touch operation functions in apparatus main bodies or display portions configured by thinner organic EL. In recent years, the size of apparatus main bodies has been reduced while displays have increased in size and there is demand to further increase the size of display portions and to obtain multiple displays that enable simultaneous viewing of a plurality of screens. Thus, there is a method of performing switching between an accommodated state in which the size of an apparatus is small and an unfolded state in which a display portion is large by causing a display portion with flexibility to bend, thus allowing both portability and viewability.

Japanese Patent Laid-Open No. 2005-354304 discloses a digital camera including a camera portion, a grip portion, and a monitor portion with a thin sheet shape. The camera portion and the grip portion are rotatably and axially supported by a hinge portion formed along one side of the monitor portion, are turned about a shaft passing through the hinge portion, and overlap in a direction along the shaft. Also, the monitor portion wraps around the camera portion and the grip portion overlapping in the direction along the shaft, which realizes a compact size.

However, according to the related art disclosed in Japanese Patent Laid-Open No. 2005-354304, there are no places to be gripped by a user in a state in which the grip portion is covered with the monitor portion, and there is a probability that operability may be degraded.

SUMMARY OF THE INVENTION

An object of the present invention is to provide an electronic apparatus having good grip performance and operability while achieving both having a small size and viewability of an apparatus.

An electronic apparatus according to an embodiment of the present invention is an electronic apparatus including: a display that at least partially has flexibility; and a main body portion, in which the display includes a plurality of display portions, has a bending portion at each of boundaries of the plurality of display portions, and is configured to be bendable at the bending portion as a start point in response to rotation of a hinge portion that is relatively rotatably coupled to first and second display portions among the plurality of display portions, the main body portion includes a grip portion and an operation portion disposed at the grip portion, a coupling portion that rotatably couples the display to the main body portion is included, and the display is located at a position that is different from the grip portion inside an outer shape of the main body portion in an accommodated state, and the first and second display portions are unfolded and parallel to each other in an unfolded state.

Further features of the present invention will become apparent from the following description of exemplary embodiments with reference to the attached drawings.

BRIEF DESCRIPTION OF THE DRAWINGS

FIG. 5 is atop view illustrating a display unfolded state.

FIGS. 8A and 8B are top views of FIGS. 6A and 6C.

FIG. 15 is an appearance view in a case of viewing the top surface of the display in the unfolded state according to the fourth embodiment.

FIGS. 16A and 16B are diagrams for explaining a relationship between the display and a main body portion and a coupling member according to the fourth embodiment.

DESCRIPTION OF THE EMBODIMENTS

Hereinafter, preferred embodiments of the present invention will be described in detail on the basis of the accompanying drawings. In the embodiments, examples in which an electronic apparatus according to the present invention is applied to an imaging apparatus and an information processing apparatus will be described.

First Embodiment

Figure 1A:
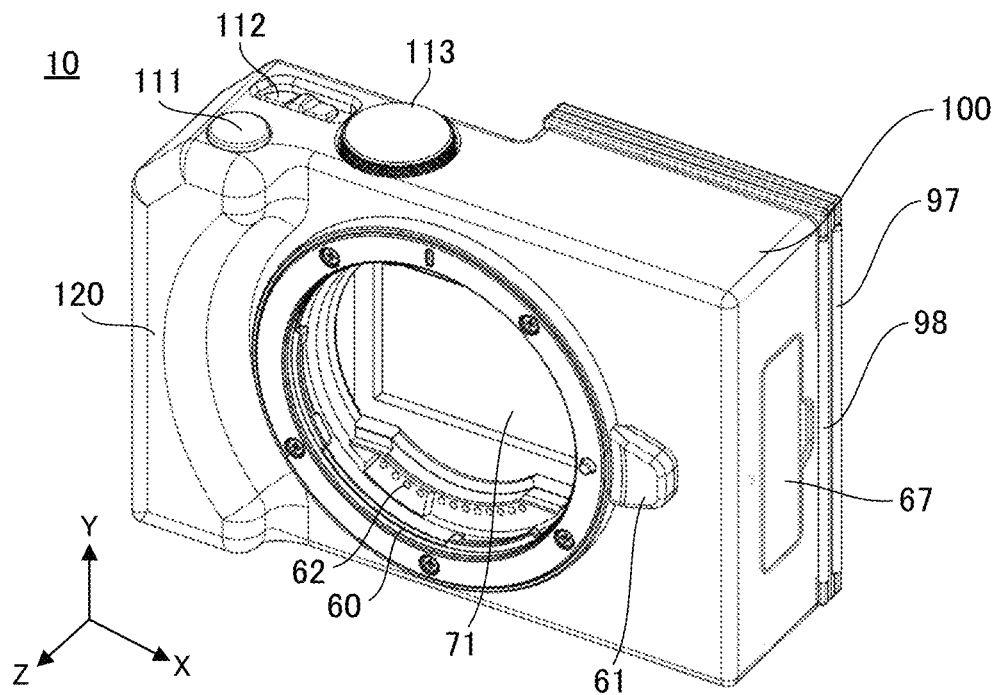
FIGS. 1A and 1B are appearance perspective views of a camera according to the present embodiment.
Figure 1B:
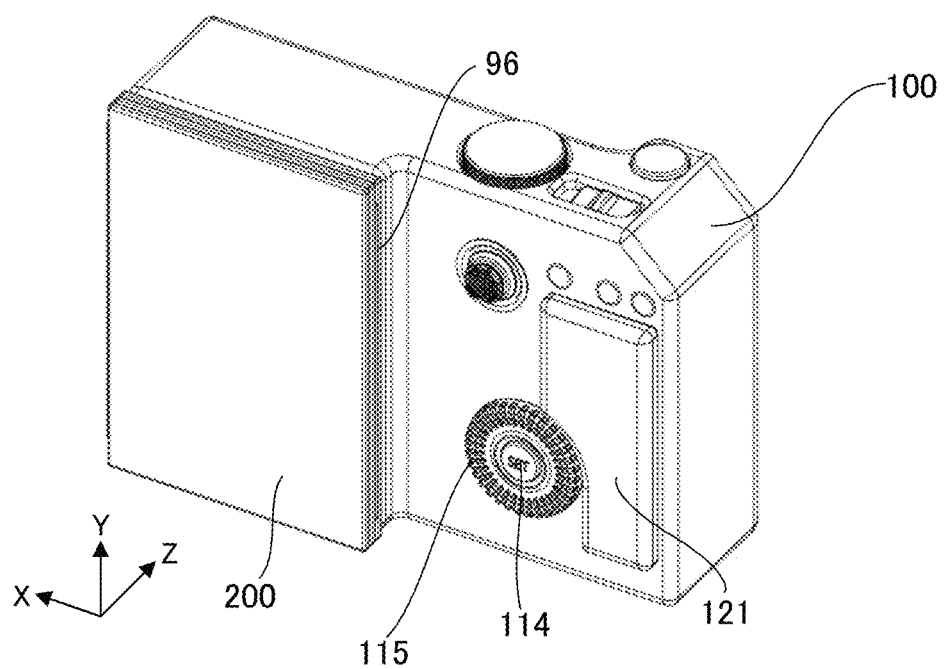
Figure 2:
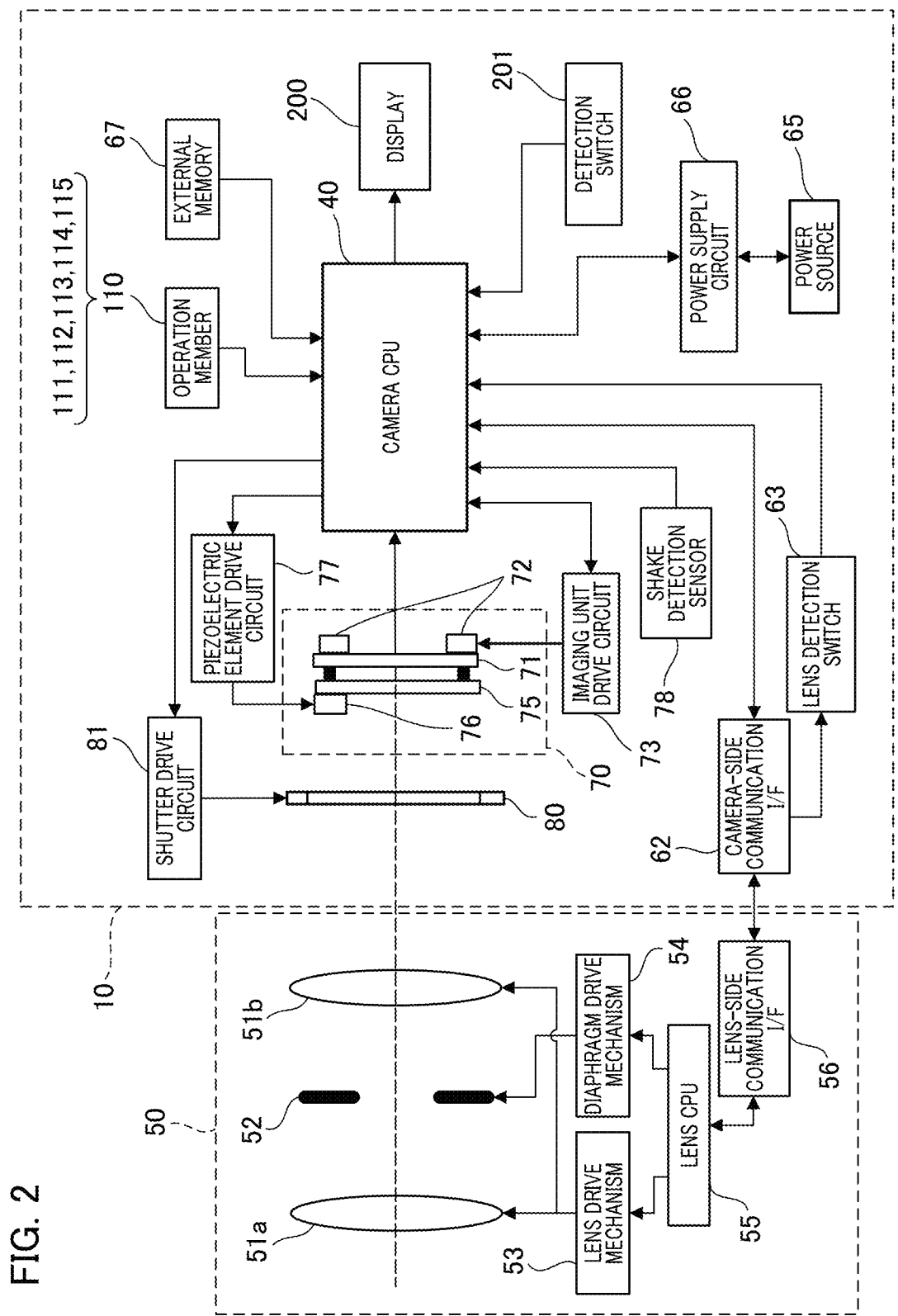
FIG. 2 is a block diagram illustrating a functional configuration of the camera according to the present embodiment.

A camera 10 according to the present embodiment will be described with reference to FIGS. 1A, 1B, and 2. FIG. 1A is an appearance perspective view in a case in which the camera 10 is seen from a side in front. FIG. 1B is an appearance perspective view in a case in which the camera 10 is seen from a rear side. A direction that is parallel to an optical axis of the camera 10 is defined as a Z-axis direction, and an X-axis direction and a Y-axis direction that perpendicularly intersect the Z-axis direction are defined. In FIG. 1, the Y-axis direction corresponds to an up-down direction, and the X-axis direction corresponds to a left-right direction. FIG. 2 is a block diagram illustrating a functional configuration of the camera 10.

The camera 10 illustrated in FIGS. 1A, 1B, and 2 is a digital camera of a lens replacement type. The camera 10 includes a grip portion 120 in a main body portion 100 that is a casing. FIG. 1 illustrates the main body portion 100 in a state in which a replacement lens unit is not attached thereto. The grip portion 120 is a grip portion for a user to hold the camera 10. The grip portion 120 is provided at least at one end of the main body portion 100 and is formed into a curved surface shape such that the user can grip the grip portion 120 so as to cover the grip portion 120 in a palm and hook his/her fingers thereon. It is possible to obtain satisfactory gripping properties by forming the surface of the grip portion 120 using an elastic member such as synthetic rubber.

A lens unit 50 (FIG. 2) configures an imaging optical system and includes a focus lens 51a and a zoom lens 51b, which include a plurality of lens groups. The lens unit 50 can be detached from and attached to a mounting opening 60 on a front surface of the camera 10 by an operation of pressing a lens attachment/detachment button 61. The lens unit 50 includes a diaphragm 52 that adjusts the aperture amount. A lens drive mechanism 53 drives the focus lens 51a and the zoom lens 51b and performs focusing and zoom driving. A diaphragm drive mechanism 54 drives the diaphragm 52 and controls a diaphragm value. A lens central processing unit (CPU) 55 performs various kinds of signal processing and controls each component in the lens unit 50.

The main body portion 100 and the lens unit 50 of the camera 10 are able to communicate by being electrically connected to each other with a camera-side communication interface (I/F) portion 62 and a lens-side communication I/F portion 56. Also, power is supplied from the main body portion 100 to the lens unit 50. A lens detection switch 63 included in the main body portion 100 determines whether or not the main body portion 100 and the lens unit 50 of the camera 10 can perform communication via the camera-side communication I/F portion 62 and the lens-side communication I/F portion 56. In addition, the lens detection switch 63 can identify the type of the lens unit 50 attached to the main body portion 100 of the camera 10.

The camera CPU 40 controls the operation of each element in the camera 10. Hereinafter, the camera CPU 40 will be simply referred to as a CPU 40. A power source 65 supplies power to each element in the camera 10. The power source 65 is a secondary battery configured as a battery pack that can be attached to and detached from the camera 10. A power supply circuit 66 converts a voltage of the power source 65 into a voltage necessary for operations of each element in the camera 10.

A shutter 80 is configured as a focal plane shutter and performs control of incidence of an imaging light flux by allowing exposure of and covering an imaging element 71. A shutter drive circuit 81 causes a shutter curtain (not illustrated) to perform opening and closing operations, and it is thus possible to cause the imaging element 71 to transition to or be held in an exposed state (opened state) or a blocked state (closed state).

The imaging element 71 takes the imaging light flux from the lens unit 50 and performs photoelectric conversion. A complementary metal oxide semiconductor (CMOS) image sensor or a charge coupled device (CCD) image sensor is used as the imaging element 71, and the imaging element 71 has an electronic shutter function. A rectangular optical low-pass filter 75 made of a material such as crystal quartz is disposed in a front surface of the imaging element 71. A piezoelectric element 76 is adhesively held on the surface of the optical low-pass filter 75 and causes the optical low-pass filter 75 to vibrate in a waveform manner in the Z-axis direction by applying a voltage thereto. A piezoelectric element drive circuit 77 that controls power distribution to the piezoelectric element 76 is electrically connected to the piezoelectric element 76 via a piezoelectric element flexible substrate, which is not illustrated. It is possible to cause the optical low-pass filter 75 to vibrate in different vibration modes of a plurality of orders through control of power distribution to the piezoelectric element 76. It is thus possible to remove dust adhering to the surface of the optical low-pass filter 75.

A shaking detection sensor 78 is, for example, an angular speed sensor, periodically detects an angular speed of the camera 10, and converts the angular speed into an electrical signal. An output of the shaking detection sensor 78 is acquired by the CPU 40 as a shaking amount detection signal of the camera 10.

An imaging unit drive mechanism 72 drives the imaging element 71. The imaging unit 70 includes the imaging element 71, the optical low-pass filter 75, the piezoelectric element 76, and the imaging unit drive mechanism 72. A drive coil (not illustrated) for driving the imaging element 71 in a plane (X-Y plane) that perpendicularly intersects the optical axis of the camera 10, a permanent magnet (not illustrated), and a position detection sensor (not illustrated) are provided. The imaging unit drive circuit 73 is electrically connected to the imaging unit drive mechanism 72 via the imaging unit drive mechanism flexible substrate, which is not illustrated, and controls power distribution to the imaging unit drive mechanism 72. The CPU 40 can correct image deviation by driving the imaging unit 70 in a direction in which shaking of the camera 10 is canceled out, in accordance with a detection result of the shaking detection sensor 78. An external memory 67 is constituted by a semiconductor memory card that can be attached to and detached from the main body portion 100 and records captured image data.

A display 200 includes a display device (an organic electro-luminescence (EL) element, for example) provided on the rear surface of the camera 10. The display 200 performs display of a captured through-the-lens image, display of settings of the main body portion 100, display of a captured image, and the like. The display 200 at least partially has flexibility and has a bendable configuration. Also, the display 200 has a touch panel function. In other words, a touch detection portion of an electrostatic capacitance type or a pressure sensitive type is incorporated, and the user can perform touch operations with a finger or the like. Note that details of the configuration of the display 200 will be described later.

The display 200 is attached to a first holding member 202, a second holding member 203, and a third holding member 204 (see FIG. 3) formed through pressing of a sheet metal material or molding of a resin material. The detection switch 201 is configured using a magnet, a Hall element, and the like and detects a relative position between each of the first holding member 202, the second holding member 203, and the third holding member 204 and the main body portion 100. The detection switch 201 outputs a detection signal to the CPU 40.

The CPU 40 performs control by receiving instructions from various operation members 110. A plurality of buttons, dials, and the like used by the user to perform setting of the main body portion 100 and imaging operations are provided in the top surface and the rear surface of the main body portion 100. Specifically, a shutter button 111 that performs an imaging operation, a power switch 112 that switches the power source between on and off, and a mode dial 113 that switches an imaging mode are included as illustrated in FIG. 1A. As illustrated in FIG. 1B, a selection button 114 that selects various kinds of settings and a setting button 115 that determines various kinds of setting are included.

As illustrated in FIG. 1B, a thumb rest 121 is disposed in the rear surface of the main body portion 100. The thumb rest 121 is a part molded from an elastic member, for example, from a soft rubber material or a foam body in a region which a palm bottom overlaps at the time of gripping.

A first hinge portion 96 (see FIG. 1B) relatively rotatably couples the first holding member 202 and the second holding member 203. A second hinge portion 97 relatively rotatably couples the second holding member 203 and the third holding member 204. Note that details of configurations of the first hinge portion 96 and the second hinge portion 97 will be described later.

A main body coupling member 98 (see FIG. 3) relatively rotatably couples the main body portion 100 and the first holding member 202. The main body coupling member 98 constitutes a coupling portion that rotatably couples the display 200 to the main body portion 100. The coupling portion is disposed in the main body portion 100 on a side opposite to a side on which the operation portion (selection buttons 114 and 115) is disposed with respect to substantially a center of the electronic apparatus. A rotation axis of the coupling portion and a rotation axis of each bending portion, which will be described later, are parallel to each other.

Figure 3:
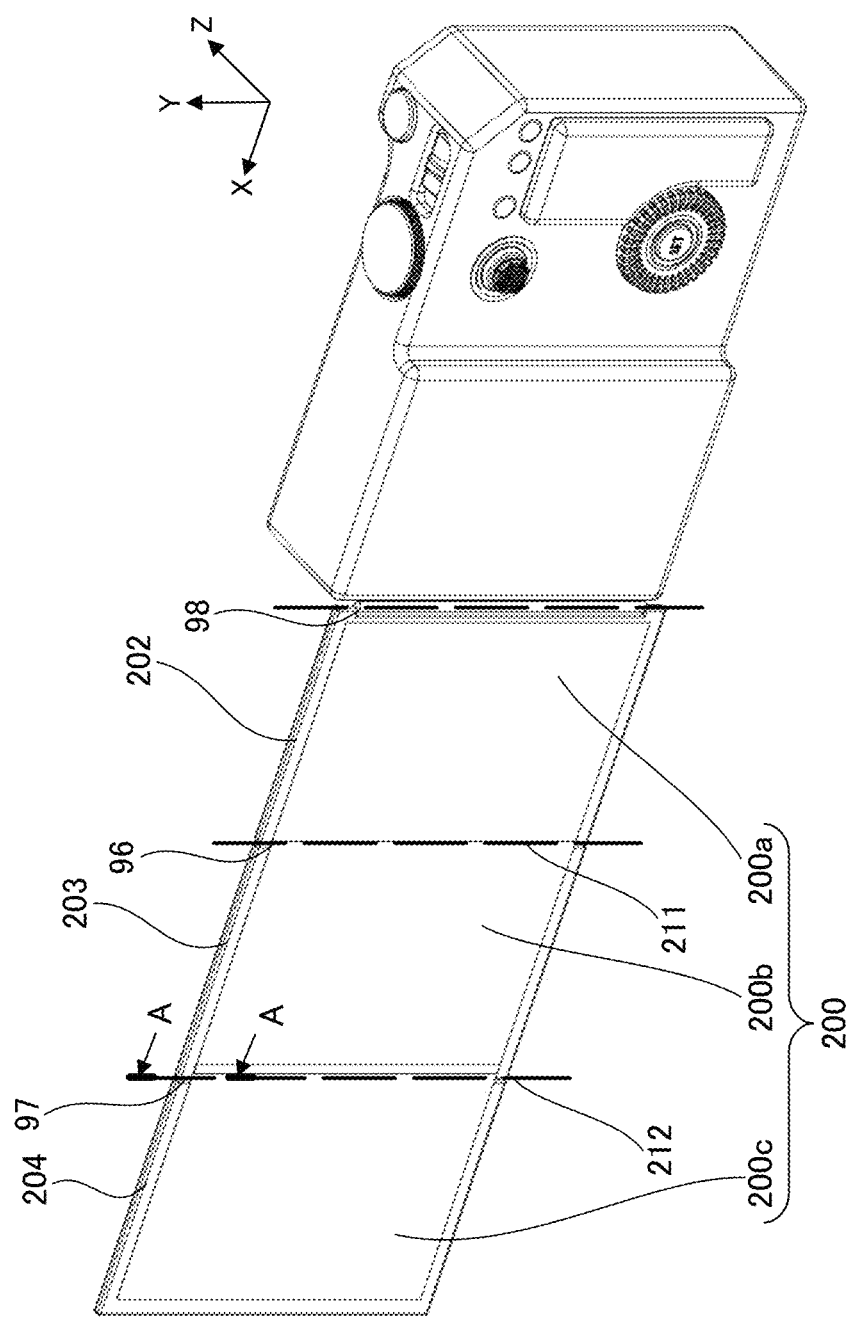
FIG. 3 is an appearance perspective view illustrating a state in which a display is unfolded.
Figure 4:
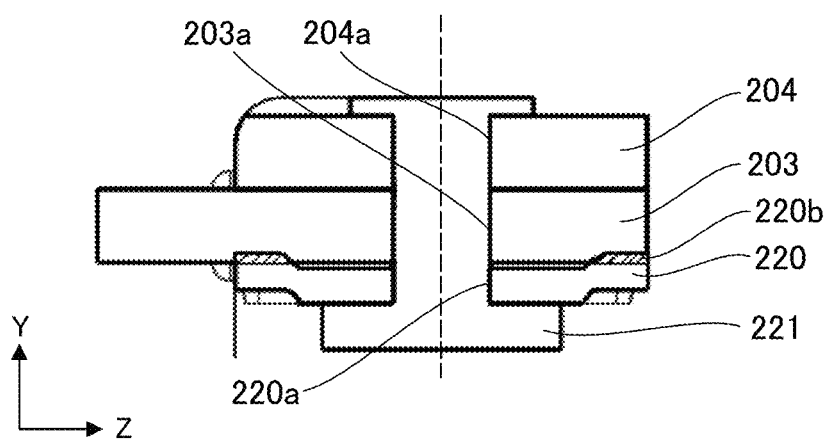
FIG. 4 is a sectional view of a second hinge portion along A-A in FIG. 3.

Next, a configuration in which the display 200 can be bent will be described with reference to FIGS. 3 and 4. FIG. 3 is an appearance perspective view illustrating a state in which the display 200 is unfolded. FIG. 4 is a sectional view illustrating the second hinge portion 97 along A-A in FIG. 3. In FIG. 3, the display 200 configured by an organic EL or the like has a rectangular shape and is formed of a material in a thin film shape. The display 200 is configured to be bendable at the first bending portion 211 and the second bending portion 212 provided at predetermined positions in the longitudinal direction (the X-axis direction in FIG. 3). In other words, the display 200 includes a bending portion at each of the boundaries of the plurality of display portions. Also, the display 200 is sectioned into a first display portion 200a, a second display portion 200b, and a third display portion 200c virtually split by the first bending portion 211 and the second bending portion 212.

In a relationship between the display 200 and the holding members 202 to 204, the first holding member 202 holds a position corresponding to the first display portion 200a by double-sided tape or the like. The second holding member 203 holds a position corresponding to the second display portion 200b by a double-sided tape or the like. The third holding member 204 holds a position corresponding to the third display portion 200c by a double-sided tape or the like. Although an example in which the display 200 is attached to and held by the first to third holding members 202 to 204 using double-sided tapes or the like is illustrated in this embodiment, other known techniques may be used. For example, there may be a configuration in which the display is held by causing the front and the back of the display 200 in the thickness direction (the Z-axis direction in FIG. 3) to be pinched at groove-shaped portions provided in the first holding member 202, the second holding member 203, and the third holding member 204.

The first hinge portion 96 is provided at a position corresponding to each of both ends of the first bending portion 211 in a predetermined direction (the Y-axis direction in FIG. 3). The second hinge portion 97 is provided at a position corresponding to each of both ends of the second bending portion 212 in the predetermined direction (the Y-axis direction in FIG. 3).

A detailed configuration of the second hinge portion 97 will be described with reference to FIG. 4. Note that since the same configuration as that of the second hinge portion 97 is employed for the first hinge portion 96 and the main body coupling member 98 in the present embodiment, only the configuration of the second hinge portion 97 will be described.

In FIG. 4, a second insertion hole 203a is formed in the Y-axis direction in the drawing in the second holding member 203. A third insertion hole 204a is formed in the Y-axis direction in the drawing in the third holding member 204. A disc spring 220 is a substantially circular member formed through pressing of a sheet metal material, and an insertion hole 220a is formed in the Y-axis direction in the drawing. Also, a biasing portion 220b formed into a projecting shape in the Y-axis direction in the drawing is provided at a part of the outer shape of the disc spring 220.

A shaft 221 formed of metal and having a shaft-shaped portion is inserted into the insertion hole 220a, the second insertion hole 203a, and the third insertion hole 204a. It is possible to hold, in a pinching manner, the disc spring 220, the second holding member 203, and the third holding member 204 through crimping of both end portions of the shaft 221.

In this manner, a configuration in which the second holding member 203 and the third holding member 204 are rotatable about the axial center of the shaft 221 is employed. As illustrated in FIG. 4, a configuration in which a frictional force is caused by pressing the biasing portion 220b against a part of the second holding member 203 and the relative positions of the second holding member 203 and the third holding member 204 can be held at desired positions is employed.

Although a so-called monoaxial hinge configuration in which the second holding member 203, the third holding member 204, and the disc spring 220 are held by the disc spring 220 in a pinched manner is employed for the second hinge portion 97 in the present embodiment, other known techniques may be used. For example, there is a so-called biaxial hinge configuration in which each of the second holding member 203 and the third holding member 204 is provided with the disc spring 220 and a shaft and the shafts are coupled to each other. Also, each of the second holding member 203 and the third holding member 204 may be coupled with an elastic member such as a synthetic rubber member.

In the present embodiment, the first bending portion 211 and the second bending portion 212 are provided at substantially the same positions as those of the first hinge portion 96 and the second hinge portion 97 in the longitudinal direction (the X-axis direction in FIG. 3) of the display 200. In this manner, the display 200 is configured to be bent at the first bending portion 211 as a start point when the first holding member 202 and the second holding member 203 relatively rotate about the axis of the first hinge portion 96. Also, the display 200 is configured to be bent at the second bending portion 212 as a start point when the second holding member 203 and the third holding member 204 relatively rotate about the axis of the second hinge portion 97.

As described above, the camera 10 has a configuration of being deformable into a state in which the display 200 is bent and accommodated (the state in FIG. 1, which will be referred to as an accommodated state below) and a state in which the display 200 is unfolded (the state in FIG. 3, which will be referred to as an unfolded state below). The display 200 is located at a different position from the grip portion inside the outer shape of the main body portion 100 in the accommodated state, and each of the display portions can be unfolded such that they become parallel to each other in the unfolded state.

Next, a bendable range of the display 200 will be described with reference to FIG. 5. FIG. 5 is an appearance view of the display 200 in the unfolded state when seen from the top surface. A rotation angle when the first holding member 202 and the second holding member 203 relatively rotate about the axis of the first hinge portion 96 will be referred to as θ1. The angular range of θ1 is as follows.

180°≤θ1≤360°

The state in which θ1=180° is a state in which the first holding member 202 and the second holding member 203 are adjacent to each other in a direction parallel to the X-axis direction in the drawing. The state in which θ1=180° is a state in which the first display portion 200a and the second display portion 200b are adjacent to each other in a direction parallel to the X-axis direction in the drawing. From this state, the first holding member 202 and the second holding member 203 can rotate about the axis of the first hinge portion 96 in the clockwise direction and transition to a state of 360° in which the first holding member 202 and the second holding member 203 overlap each other in the Z-axis direction in the drawing.

Next, a rotation angle when the second holding member 203 and the third holding member 204 relatively rotate about the axis of the second hinge portion 97 will be referred to as θ2. The angular range of θ2 is as follows.

0°≤θ2≤360°

The second holding member 203 and the third holding member 204 can rotate about the axis of the second hinge portion 97 in the clockwise direction from the state of 0° in which the second holding member 203 and the third holding member 204 overlap each other in the Z-axis direction in the drawing and transition to a state of 360° in which the second holding member 203 and the third holding member 204 overlap each other in the Z-axis direction in the drawing. When the second holding member 203 and the third holding member 204 rotate about the axis of the second hinge portion 97 in the clockwise direction, the display 200 is bent at the second bending portion 212 as a start point. Also, the second display portion 200b and the third display portion 200c overlap each other back to back in the Z-axis direction in the drawing in the state in which θ2 is 360°.

Next, a rotation angle when the first holding member 202 and the main body portion 100 relatively rotate about the axis of the main body coupling member 98 will be referred to as θ3. The angular range of θ3 is as follows.

0°≤θ3≤180°

In a state in which the first holding member 202 and the main body portion 100 are located at 0° around the axis of the main body coupling member 98, the first display portion 200a and the main body portion 100 overlap each other face-to-face in the Z-axis direction in the drawing. When the first holding member 202 and the main body portion 100 rotate about the axis of the main body coupling member 98 in the clockwise direction, the first display portion 200a and the main body portion 100 are in an adjacent state in a direction parallel to the X-axis direction in the drawing in a state in which θ3 is 180°.

With the aforementioned configuration, the display 200 can take various postures by rotating at each bending portion relative to the main body portion 100. Advantages thereof will be described with reference to FIGS. 6A, 6B, 6C, 6D, 6E, 6F, 7A, and 7B. FIGS. 6A, 6B, 6C, 6D, 6E, 6F, 7A, and 7B are appearance views illustrating a combination of the angle of each rotatable portion that can be taken by the display 200 relative to the main body portion 100.

Figure 6A:
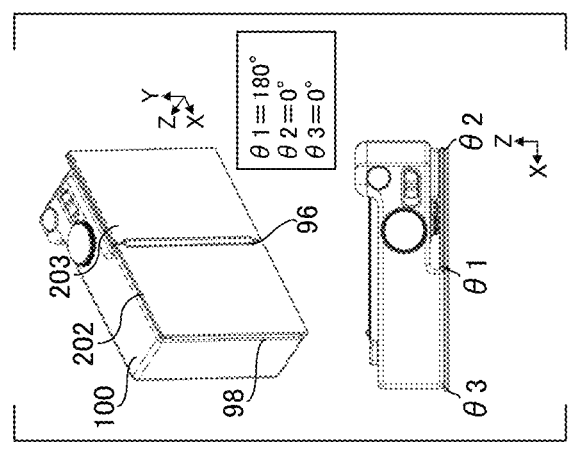
FIGS. 6A, 6B, 6C, 6D, 6E, and 6F are appearance views illustrating an example of a combination of an angle of each rotatable portion of the display relative to a main body portion.

FIG. 6A is a diagram illustrating a posture of the display 200 relative to the main body portion 100 when each rotatable portion is in the state of the following angles.

θ1=180°, θ2=0°, and θ3=0°

When the display 200 is in the state of FIG. 6A, the first display portion 200a, the second display portion 200b, and the third display portion 200c are in a state of not being exposed in an external appearance view. It is thus possible to avoid a risk that the display portions are erroneously damaged when the camera 10 is carried. Also, since the display 200 overlaps the selection button 114 and the setting button 115 that are operation members on the rear surface of the main body portion 100, it is possible to prevent erroneous operations at the time of carrying.

Figure 6B:
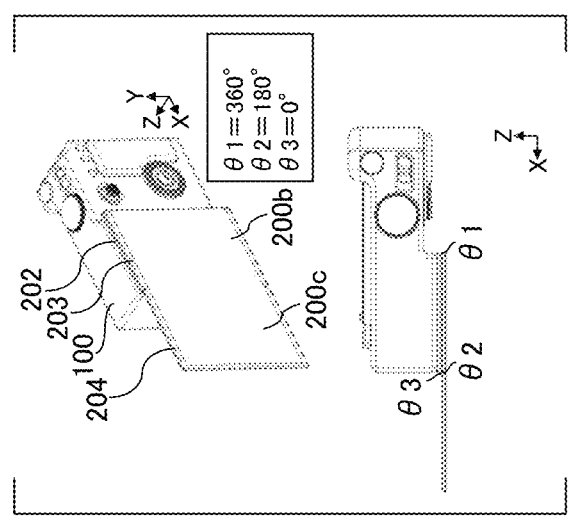

FIG. 6B is a diagram illustrating a posture of the display 200 relative to the main body portion 100 when each rotatable portion is in the state of the following angles.

θ1=360°, θ2=180°, and θ3=0°

When the display 200 is in the state of FIG. 6B, the second display portion 200b and the third display portion 200c are in an exposed state. In this manner, the user can perform imaging while checking images displayed on the second display portion 200b and the third display portion 200c while gripping the grip portion 120 and operating the operation member 110 and can also check a reproduced image. Since the operation member 110 is a physical operation button with a dial or press-button structure, it is possible to perform an operation thereon without checking the position every time when the operation member 110 is operated in a dark place or the like.

Figure 6C:
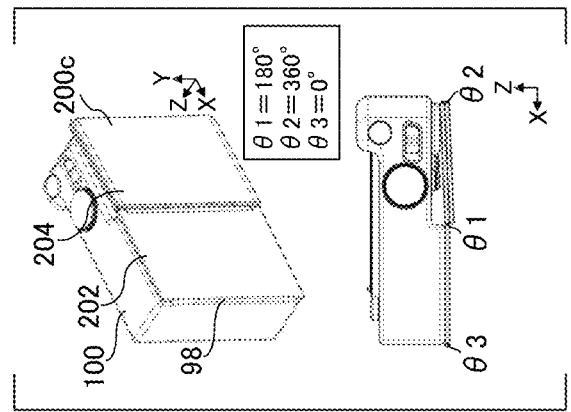

FIG. 6C is a diagram illustrating a posture of the display 200 relative to the main body portion 100 when each rotatable portion is in the state of the following angle.

θ1=180°, θ2=360°, and θ3=0°

When the display 200 is in the state of FIG. 6C, the display 200 overlaps the selection button 114 and the setting button 115 in the thickness direction (the Z-axis direction in the drawing), and the third display portion 200c is in the exposed state. In this manner, the user can perform so-called touch shutter imaging, in which the user performs imaging by gripping the grip portion 120 and selecting a distance measurement point through direct touch on a current acquired image (hereinafter, referred to as a through-the-lens image) of the imaging element 71 displayed on the third display portion 200c. In the touch shutter imaging, the distance measurement point can be easily selected.

A state in which the user can use the physical operation button as in FIG. 6B with a stable posture of gripping the grip portion 120 maintained and a state in which the touch operation as in FIG. 6C can be performed can be switched between. In other words, a configuration in which the operation member can be switched depending on an imaging condition is employed.

Figure 6D:
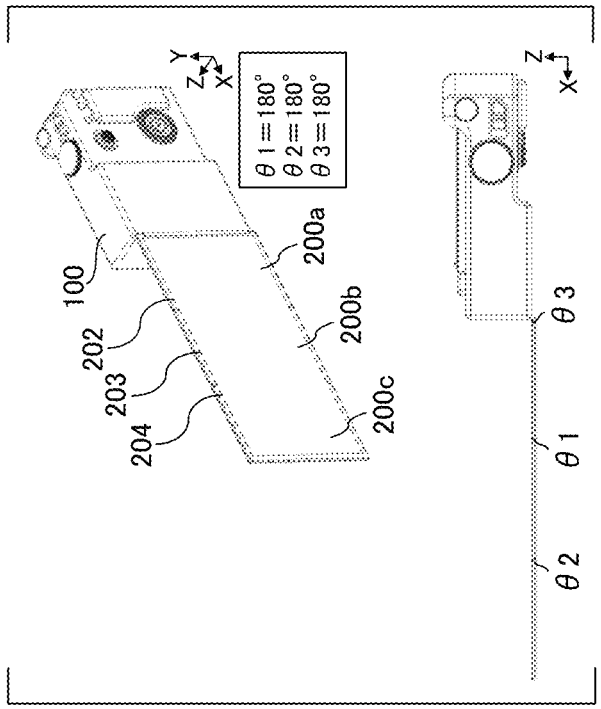

FIG. 6D is a diagram illustrating a posture of the display 200 relative to the main body portion 100 when each rotatable portion is in the state of the following angles.

$$\theta 1=315°, \theta 2=180°, \text{ and } \theta 3=0°$$

When the display 200 is in the state of FIG. 6D, a state in which the second display portion 200b and the third display portion 200c are obliquely inclined relative to the main body portion 100 and are exposed is achieved. In this manner, the user can perform imaging at a high angle or a low angle while checking images displayed on the second display portion 200b and the third display portion 200c while gripping the grip portion 120 and operating the operation member 110.

Figure 6E:
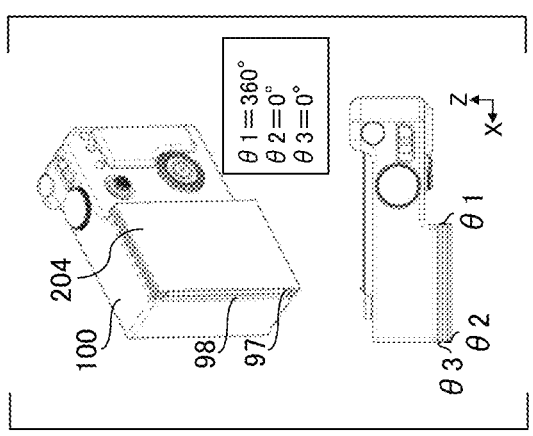

FIG. 6E is a diagram illustrating a posture of the display 200 relative to the main body portion 100 in a state in which each rotatable portion is in the state of the following angle.

$$\theta 1=360°, \theta 2=0°, \text{ and } \theta 3=0°$$

When the display 200 is in the state of FIG. 6E, a state in which all the first display portion 200a, the second display portion 200b, and the third display portion 200c overlap each other, that is, the accommodated state is achieved. The user can thus change various kinds of setting using the selection button 114 and the setting button 115 that are the operation members on the rear surface while protecting the display portion.

Figure 6F:
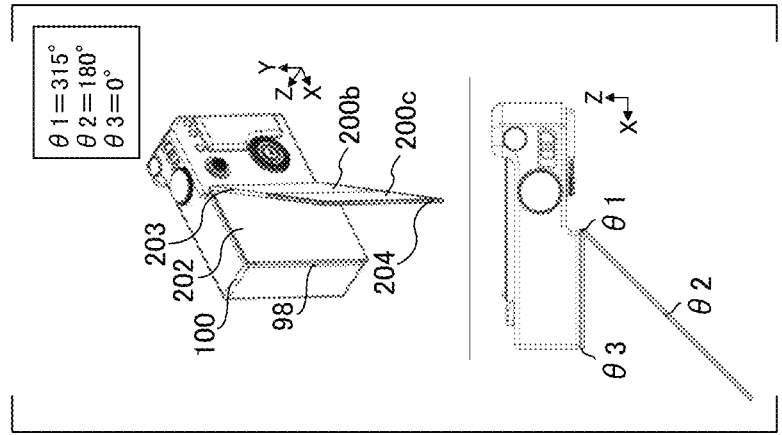

FIG. 6F is a diagram illustrating a posture of the display 200 relative to the main body portion 100 when each rotatable portion is in the state of the following angles.

$$\theta 1=180°, \theta 2=180°, \text{ and } \theta 3=180°$$

When the display 200 is in the state of FIG. 6F, a state in which the first display portion 200a, the second display portion 200b, and the third display portion 200c are exposed in a line in the X-axis direction in the drawing, that is, the unfolded state is achieved. The user can thus perform imaging while checking an image in a state in which the display region is further enlarged as compared with the state in FIG. 6B and can check a reproduced image.

Figure 7A:
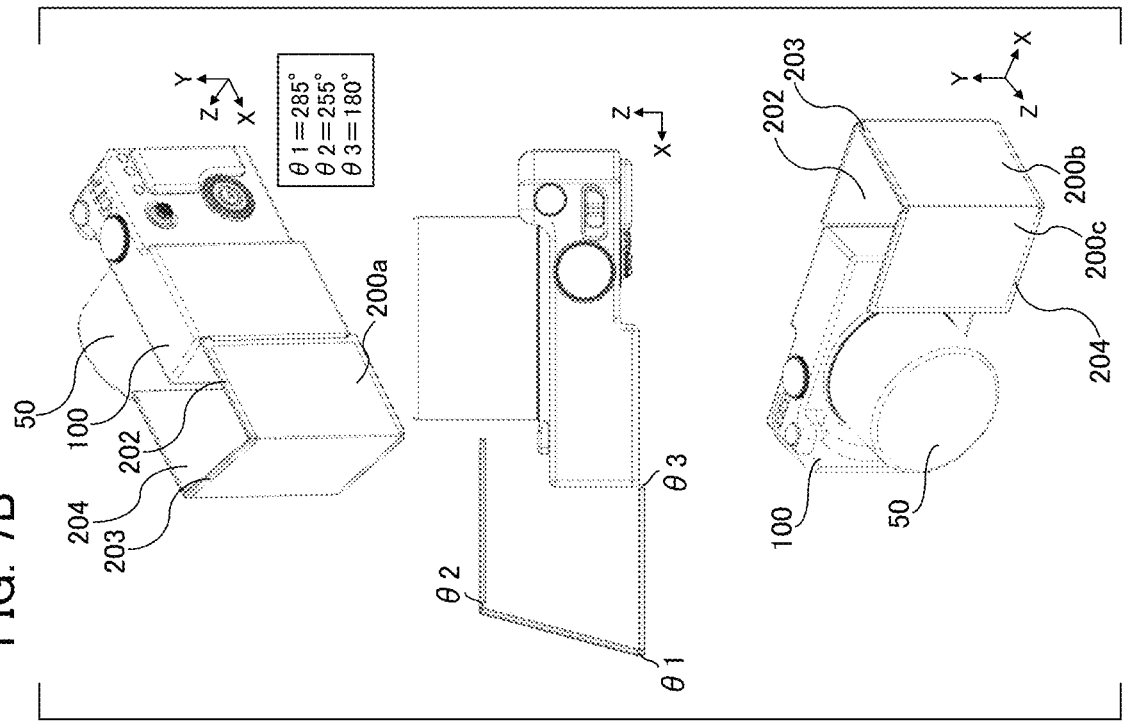
FIGS. 7A and 7B are appearance views illustrating another example of the combination of the angle of each rotatable portion of the display relative to the main body portion.

FIG. 7A is a diagram illustrating a posture of the display 200 relative to the main body portion 100 when each rotatable portion is in the state of the following angles.

$$\theta 1=180°, \theta 2=360°, \text{ and } \theta 3=180°$$

When the display 200 is in the state of FIG. 7A, the third display portion 200c is in the posture of facing a side of an object while the first display portion 200a and the second display portion 200b is in the posture of facing a side of a person who captures the image. It is possible to employ a configuration in which the first display portion 200a and the second display portion 200b are configured as an integrated display portion, the third display portion 200c is configured as an independent display portion, and a through-the-lens image is displayed on each of the display portions. It is thus possible for a person who is an object to check the current imaged state when the person is imaged. Alternatively, it is possible to configure the first display portion 200a and the second display portion 200b as an integrated display portion, to configure the third display portion 200c as an independent display portion, and display different images thereon. For example, through-the-lens images that are currently captured are displayed on the first display portion 200a and the second display portion 200b, which are configured as an integrated display portion, and a video of animals or the like that attracts attention of a child is displayed on the third display portion 200c. This enables the child to pay attention to the camera and enables expressive images to be captured with the face directed to the camera side.

Figure 7B:
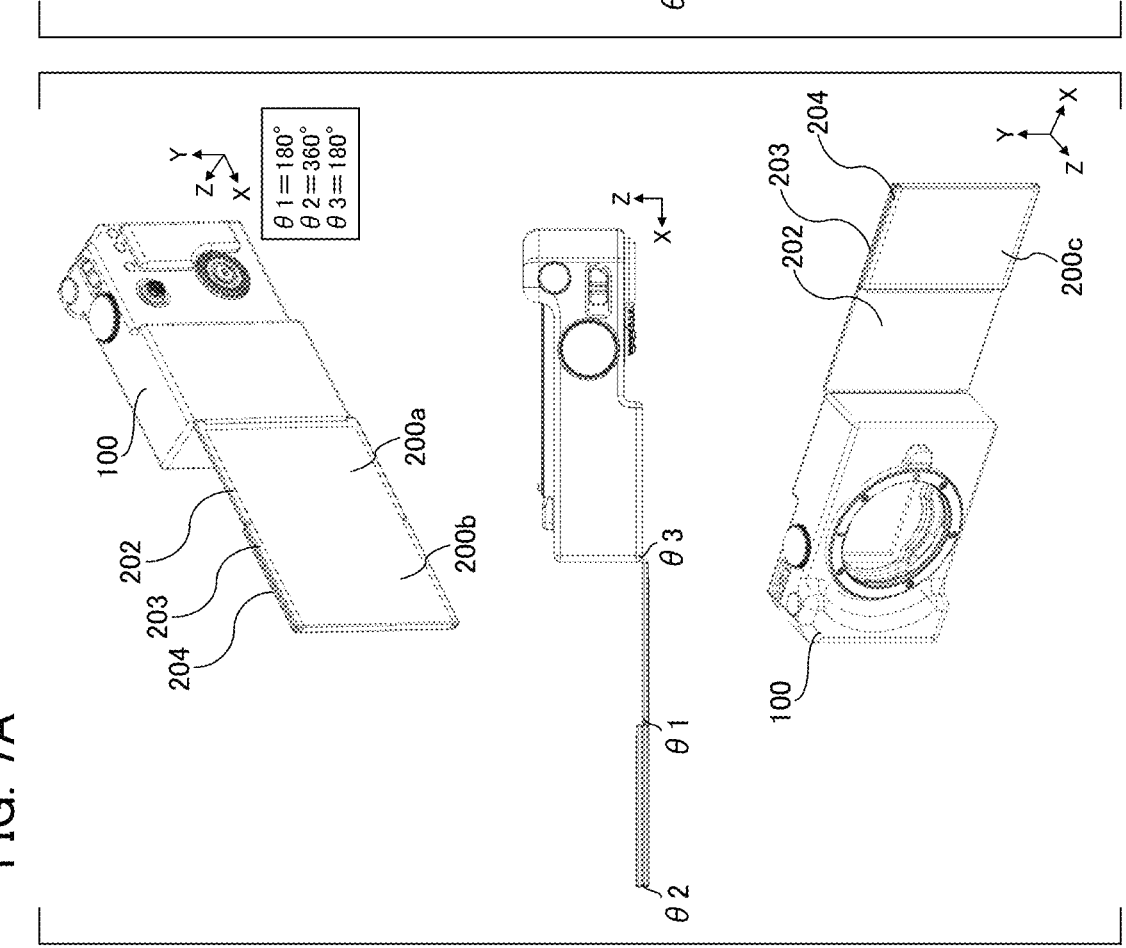

FIG. 7B is a diagram illustrating a posture of the display 200 relative to the main body portion 100 when each rotatable portion is in the state of the following angles.

$$\theta 1=285°, \theta 2=255°, \text{ and } \theta 3=180°$$

When the display 200 is in the state of FIG. 7B, the third display portion 200c is in the posture directed to the side of the object and disposed near the lens unit 50. The lens optical axis becomes substantially parallel to the eye level in so-called self-shooting, in which the user who is an object itself presses the shutter button 111 while checking the captured image, and imaging with the object looking at the camera can be easily performed, by displaying a through-the-lens image on the third display portion 200c.

As described above, advantages of the combination of each rotatable portion have been described as examples. Each component is independently rotatable within the ranges described in FIG. 5, and combinations of the angles of the rotatable portions are not limited to those described above.

Next, a configuration of the display 200 in the thickness direction will be described with reference to FIGS. 8A and 8B. FIG. 8A is a top view of FIG. 6A. FIG. 8B is a top view of FIG. 6C. The thickness of the first holding member 202 will be referred to as 202t, the thickness of the second holding member 203 will be referred to as 203t, and the thickness of the third holding member 204 will be referred to as 204t.

The distance from the surface on which the first holding member 202 is secured to the main body portion 100 to the surface to which the rear surface operation members (the selection buttons 114 and the setting button 115) are secured in the Z-axis direction in FIGS. 8A and 8B will be referred to as L. The height of the rear surface operation members (the projecting amount) from the main body portion 100 will be referred to as $\ell$.

In this case, the dimensions of the members in the Z-axis direction are in the following relationship.

$$200t=203t, \text{ and } L \geq 204t + \ell$$

With the aforementioned configuration, it is possible to bring the first holding member 202 and the second holding member 203 into a state with no level difference in the Z-axis direction when the first display portion 200a, the second display portion 200b, and the third display portion 200c are brought into postures that are not exposed to the appearance at all as in FIG. 8A. This improves accommodating properties at the time of carrying and an aesthetic appearance.

Moreover, the thumb rest 121 is disposed in the region in which the palm bottom overlaps the surface to which the rear surface operation members are secured at the time of gripping in the configuration of the present embodiment. In a case in which the thickness of the thumb rest 121 is referred to as 121t, the dimensions of the members are configured to satisfy the following relationship.

$$\ell < 121t \leq L - 204t$$

With the aforementioned configuration, the third holding member 204 can abut on the thumb rest 121, and it is thus possible to avoid interference between the rear surface operation members (the selection button 114 and the setting button 115) and the third holding member 204. It is thus possible to achieve a configuration in which the third holding member 204 is less likely to be damaged.

With the aforementioned configuration, a state in which the third display 200 is inclined by the amount corresponding to the thickness 204t of the third holding member 204 is achieved when the third display portion 200c is brought into the exposed state to the side of the person who captures the image as illustrated in FIG. 8B. In this manner, a configuration in which the second display portion 200b can abut on the thumb rest 121 earlier than the rear surface operation members (the selection button 114 and the setting button 115) and the second display portion 200b is less likely to be damaged can be achieved. Also, a space due to the inclination is provided at the palm bottom portion in the gripped state, and it is possible to secure an operation space at the time of a thumb touch operation. A configuration that facilitates the touch operation is thus achieved.

Figure 9A:
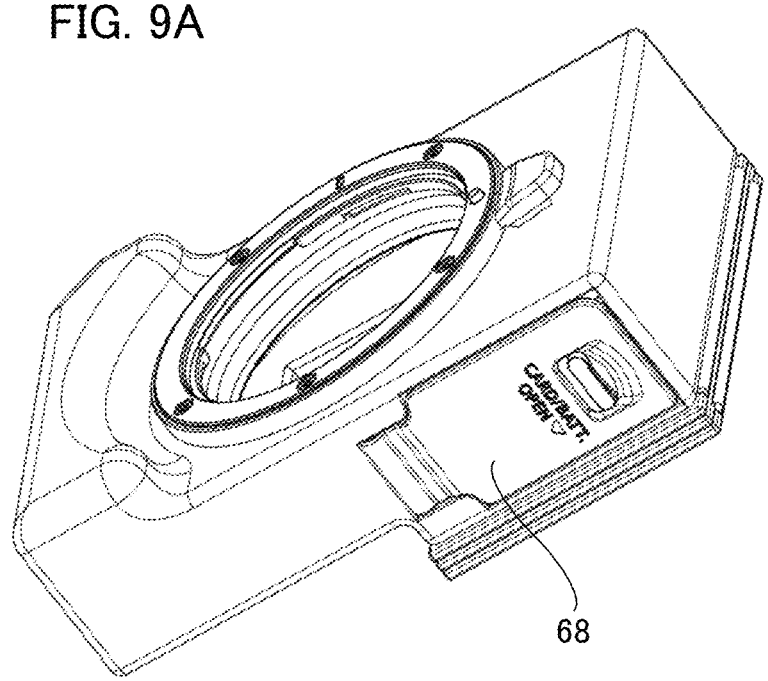
FIGS. 9A and 9B are bottom perspective views in a state in which a battery cap is closed and a state in which the battery cap is opened.
Figure 9B:
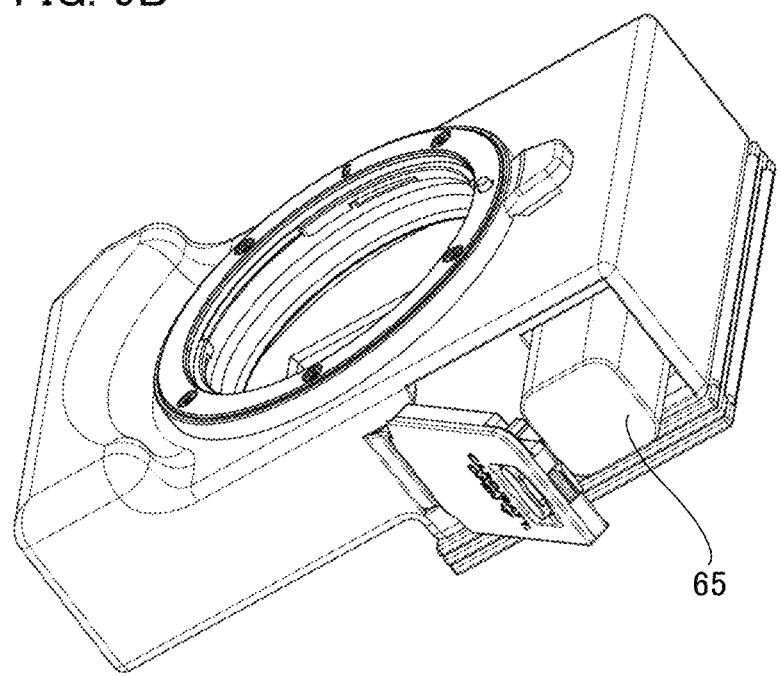

Next, a configuration for reducing the thickness of the camera 10 will be described with reference to FIGS. 9A and 9B. FIG. 9A is a bottom perspective view illustrating a state in which the battery cap 68 is closed. FIG. 9B is a bottom perspective view illustrating a state in which the battery cap 68 is opened.

As described above in FIGS. 8A and 8B, the main body portion 100 on the side of the main body coupling member 98 has an apparatus thickness increased by the amount corresponding to the thickness 204t of the third holding member with respect to the substantial center of the main body portion 100. Therefore, it is possible to achieve a configuration in which a battery with a large battery capacity can be used without any increase in size of the camera by disposing the power source 65 (a lithium ion battery, for example) and a battery chamber at this part.

Second Embodiment

An electronic apparatus according to a second embodiment of the present invention will be described with reference to FIGS. 10A, 10B, 10C, 10D, and 10E. Only parts with different configurations from those in the first embodiment will be described for simple explanation. Such a method of omitting explanation will be similarly applied to embodiments, which will be described later.

Figure 10A:
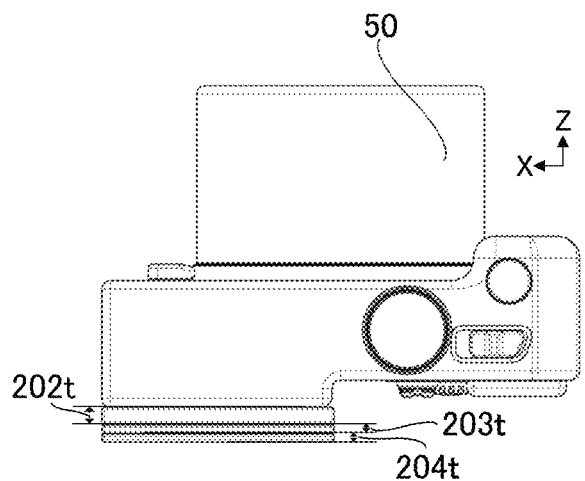
FIGS. 10A, 10B, 10C, 10D, and 10E are diagrams illustrating an electronic apparatus according to a second embodiment.
Figure 10B:
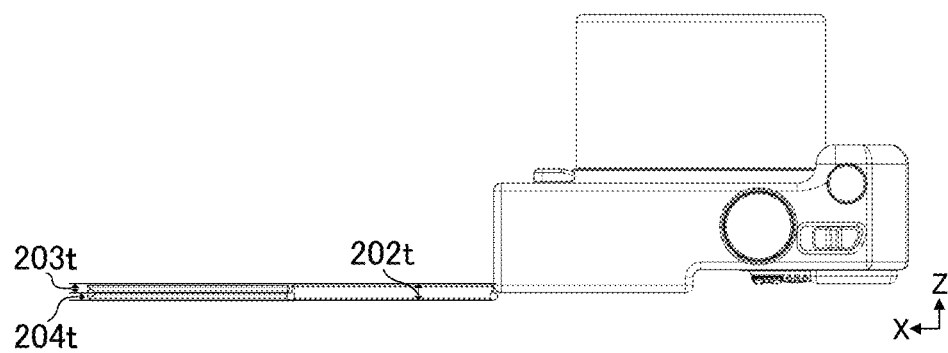
Figure 10C:
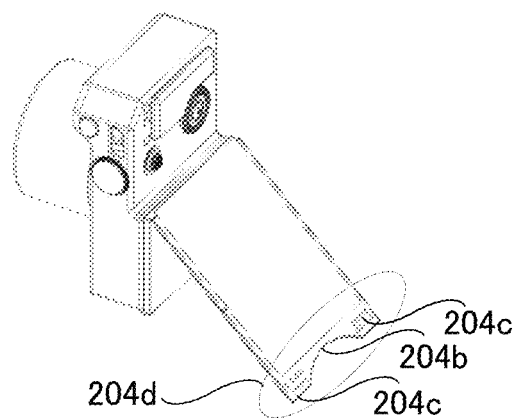
Figure 10D:
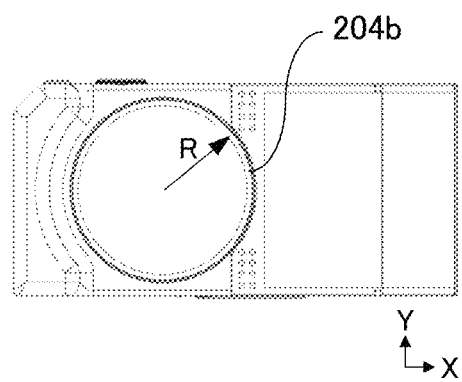
Figure 10E:
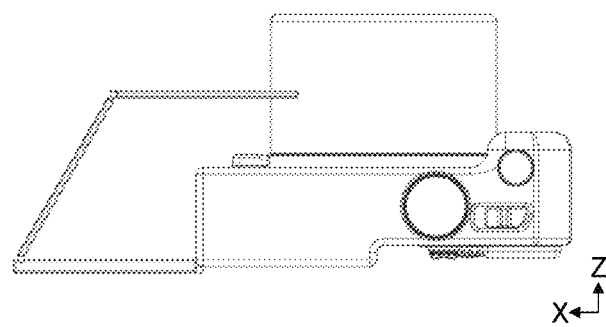

FIG. 10A is a top view of the electronic apparatus and illustrates a display accommodated state. FIG. 10B is a top view of the electronic apparatus, in which the display state is the same as that in FIG. 6F. FIG. 10C is a top perspective view of the electronic apparatus and illustrates a state in which the electronic apparatus can stand on its own with a part of the display bent. FIG. 10D is a front view of the electronic apparatus, in which the display state is the same as that in FIG. 7A. FIG. 10E is a top view of the electronic apparatus, in which the display state is the same as that in FIG. 7B.

The thickness of each holding member according to the present embodiment will be described with reference to FIGS. 10A and 10B. The thickness 202t of the first holding member, the thickness 203t of the second holding member, and the thickness 204t of the third holding member are configured to satisfy the following relationship.

$$202t = 203t + 204t$$

With the aforementioned configuration, it is possible to improve quality of the appearance since the appearance surface of the display 200 has aligned surfaces with no level difference on both front and rear sides when a posture in which the third display portion 200c is folded on the side of the object is taken as illustrated in FIG. 10B. Also, a stabler structure is achieved when an operation of causing the display 200 to rotate relative to the main body portion 100 or an operation of bending the display 200 is performed, by configuring the first holding member 202 that is closer to the main body portion 100 to have a thicker thickness 202t than the thicknesses of the other holding members.

An outer shape of the third holding member 204 according to the present embodiment will be described with reference to FIGS. 10C, 10D, and 10E. In the present embodiment, an end portion 204d made of a member that partially or entirely has elasticity, such as synthetic rubber, is included on a side of the third holding member 204 facing the second hinge portion 97.

The end portion 204a includes a recessed portion 204b and a planar portion 204c. The recessed portion 204b is formed into a recessed shape curved with a larger radius than the radius (referred to as R) of the lens unit 50. The planar portion 204c is a part with a substantially straight line shape extending from both ends of the recessed portion 204b.

With such a configuration, the following advantages are achieved when a part of the display 200 is bent and is brought into a posture in which the display 200 can stand on its own at an angle with respect to the main body portion 100 as illustrated in FIG. 10C. First, friction with a ground surface increases, and a configuration in which the camera 10 is less likely to fall down can be achieved by forming the end portion 204a as an elastic member. Also, it is possible to secure a ground area by providing the planar portion 204c. A configuration in which fingers are less likely to slop at the time of performing rotation and bending operations of the display 200 is achieved by forming the end portion 204a as an elastic member, and operability is thus improved.

Moreover, the following advantages are achieved by setting the radius of the recessed portion 204b to be equal to or greater than the radius R of the lens unit 50. A cylindrical portion of the lens unit 50 matches the recessed portion 204b when the third holding member 204 moves to a location near the lens unit 50 in order to perform self-shooting as illustrated in FIGS. 10D and 10E. Therefore, it is possible to stably hold the third display portion 200c.

Figure 11B:
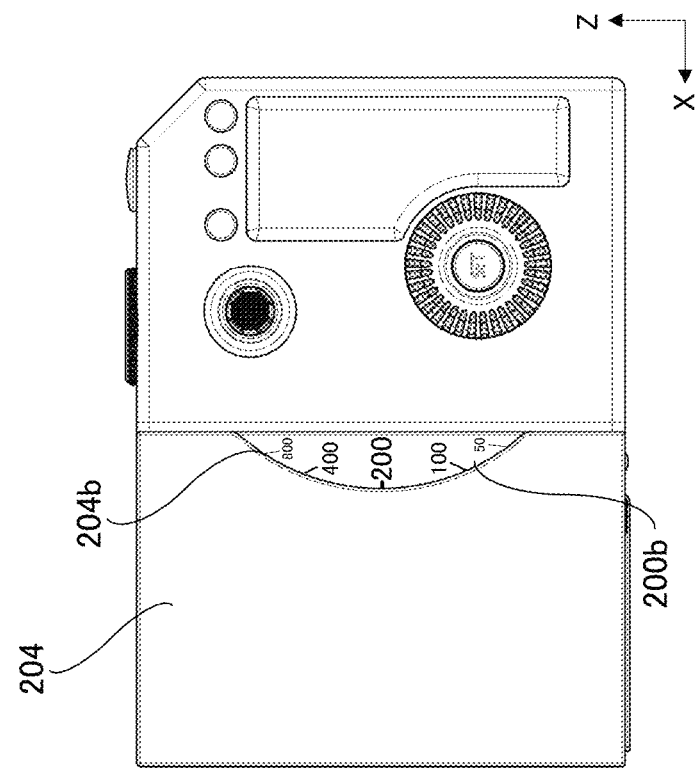
FIGS. 11A and 11B are back views illustrating a display and an operation example in a display accommodated state.
Figure 11A:
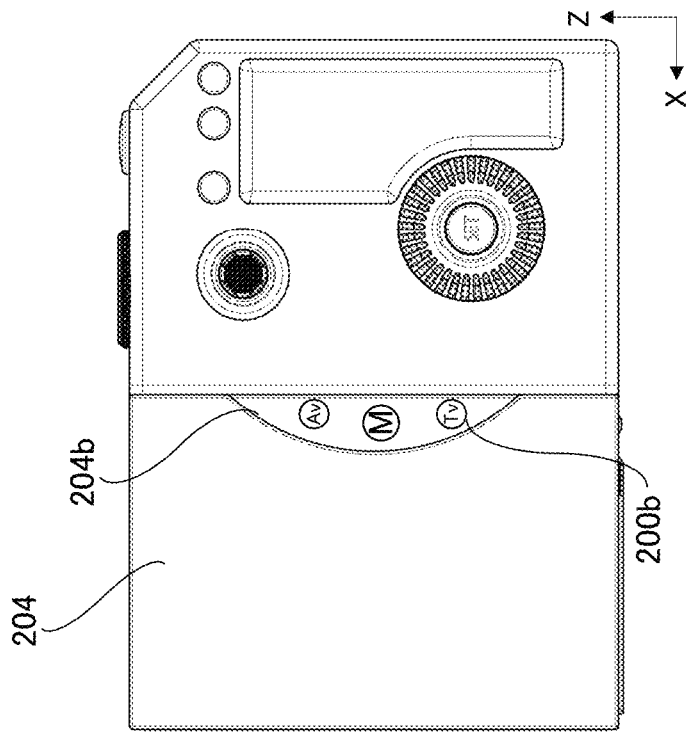

Next, a configuration example of the touch operation member according to the present embodiment will be described with reference to FIGS. 11A and 11B. FIG. 11A is a rear view of the electronic apparatus and illustrates an example in which ISO dial display is performed in the display accommodated state. FIG. 11B is a rear view of the electronic apparatus and illustrates an example in which mode dial display is performed in the display accommodated state.

Since the recessed portion 204b is provided as illustrated in FIGS. 11A and 11B, it is possible to expose a part of the second display portion 200b from the recessed portion 204b. In other words, it is possible to configure a touch operation member (operation region), with which the user performs a rotation operation while sliding his/her fingers thereon, in the recessed portion 204b by performing display of the second display portion 200b along the recessed portion 204b. In a case of a camera, it is possible to quickly and accurately perform change using a rotation operation as an operation member that changes various kinds of setting. In the example of FIG. 11A as a specific example, a numerical value representing ISO sensitivity is displayed on the second display portion 200b. The user can change the numerical value to an arbitrary value through a finger motion in the rotation operation by performing a rotation touch operation with the finger along the recessed portion 204b, and operability is improved.

In the example of FIG. 11B, an icon representing an imaging mode ("M" for manual imaging, "Av" for diaphragm priority imaging, or the like) is displayed on the second display portion 200b. The user can change the imaging mode to an arbitrary mode by performing a rotation touch operation of the finger along the recessed portion 204b, and operability is improved.

Third Embodiment

Figure 12B:
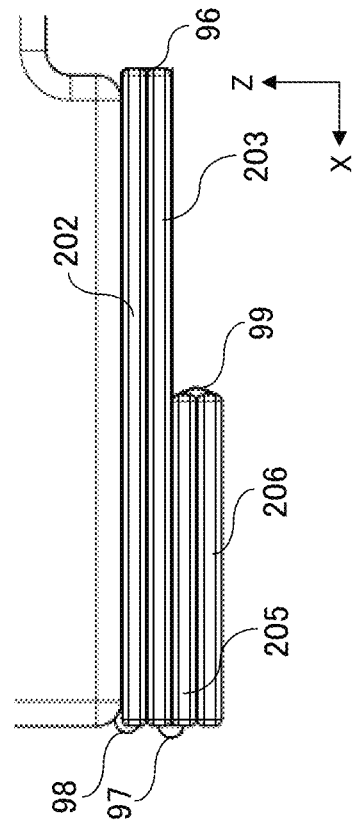
FIGS. 12A, 12B, 12C, and 12D are diagrams illustrating an electronic apparatus according to a third embodiment.
Figure 12D:
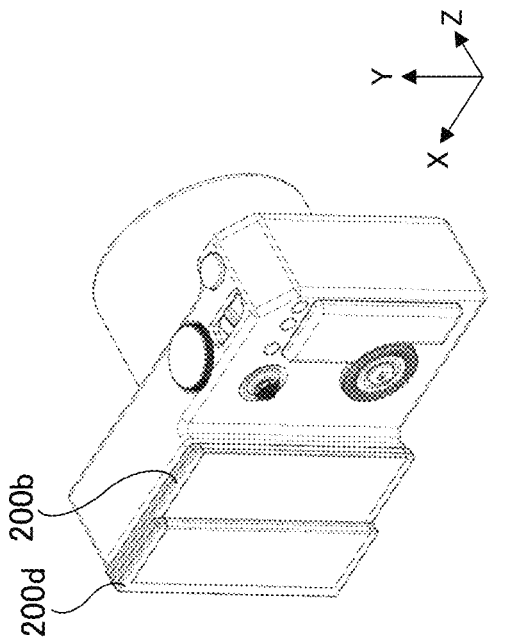
Figure 12A:
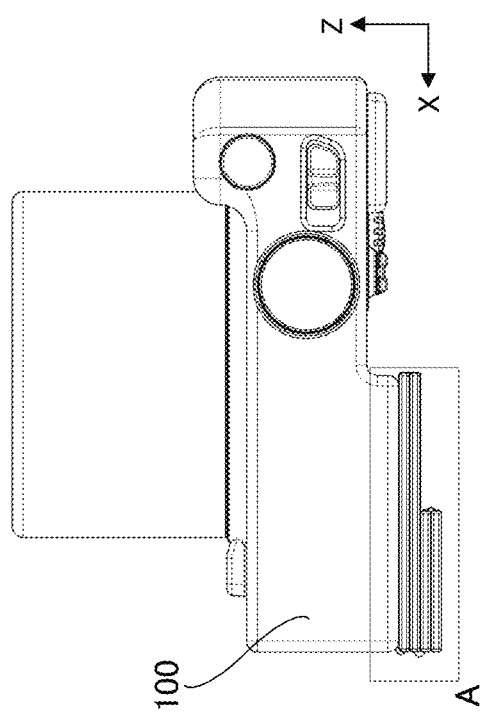
Figure 12C:
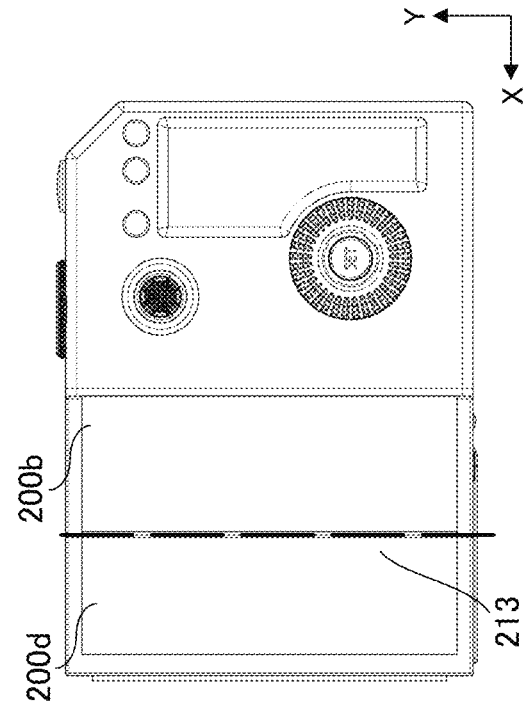

An electronic apparatus according to a third embodiment of the present invention will be described with reference to FIGS. 12A, 12B, 12C, and 12D. FIG. 12A is a top view of the electronic apparatus and illustrates a display accommodated state. FIG. 12B is an enlarged view of the enlarged part A in FIG. 12A. FIG. 12C is a rear view of the electronic apparatus and illustrates the display accommodated state. FIG. 12D is a top perspective view of the electronic apparatus.

In the present embodiment, a configuration in which one more bending portion is added to the display 200 according to the first embodiment as illustrated in FIGS. 12A and 12B is employed. Specifically, a configuration in which the third holding member 204 according to the first embodiment is further split into two parts is employed. The display 200 is provided with a third holding member 205 and a fourth holding member 206. The third holding member 205 and the fourth holding member 206 are configured to be bendable at a third bending portion 213. In this manner, the display 200 is sectioned into a first display portion 200a, a second display portion 200b, a third display portion 200c, and a fourth display portion 200d. A third hinge portion 99 has the same structure as that of other hinge portions and is provided at a position corresponding to each of both ends of the third bending portion 213 in the Y-axis direction in the drawing.

With the aforementioned configuration, a posture in which a part of the second display portion 200b and the fourth display portion 200d are exposed can be taken in the accommodated state of the display 200 as illustrated in FIGS. 12C and 12D. In this manner, it is possible to employ a configuration in which operations can be performed on the selection button 114 and the setting button 115 that are rear surface operation members while performing display on the display 200 in a state where the camera 10 is compact.

Although the example in which bending portions are provided at three locations has been described in the present embodiment, a configuration including bending portions at three or more locations may be employed. For example, there is a configuration in which the bending portions are provided at five locations by having the bending portions in the first holding member 202 and the second holding member 203. In the case of the configuration, it is possible to set the length of each holding member in the X-axis direction to be substantially half the length in the first embodiment and to thereby reduce the size of the camera 10 in the X-axis direction without changing the display area of the display 200.

Fourth Embodiment

Figure 13A:
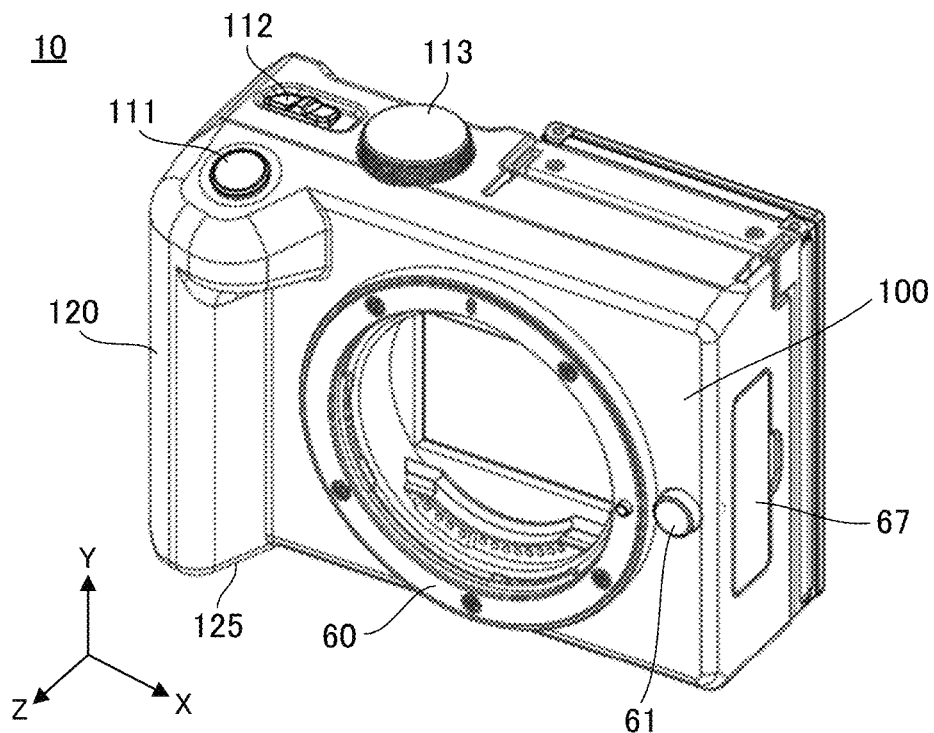
FIGS. 13A and 13B are appearance perspective views of an electronic apparatus according to a fourth embodiment.
Figure 13B:
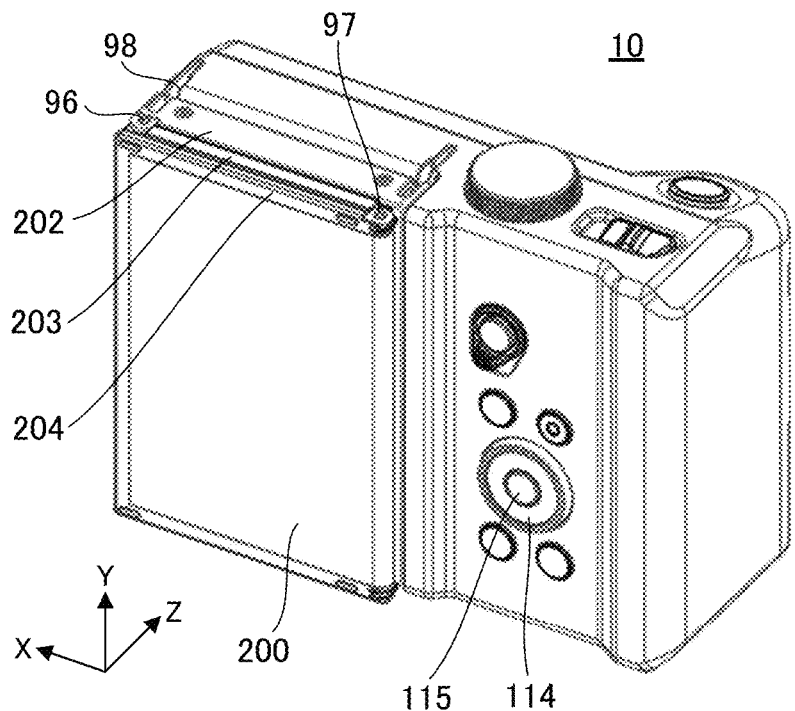

Next, a camera that is an electronic apparatus according to a fourth embodiment of the present invention will be described. FIG. 13A is an appearance perspective view of the camera 10 when seen from the front side. FIG. 13B is an appearance perspective view of the camera 10 when seen from the rear side and illustrates an accommodated state of the display 200.

Figure 14:
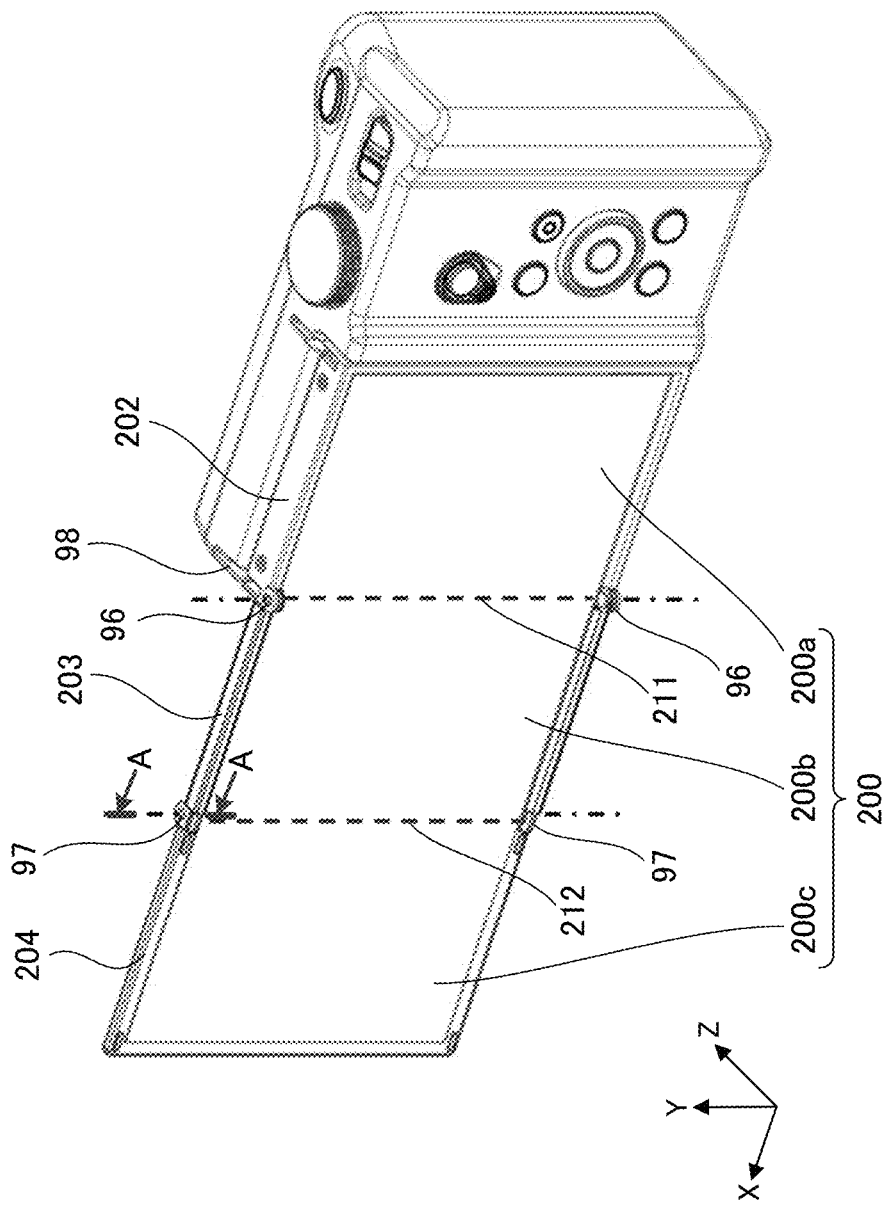
FIG. 14 is an appearance perspective view illustrating a display unfolded state according to the fourth embodiment.

FIG. 14 is an appearance perspective view illustrating an unfolded state of the display 200. The display 200 is configured to be bendable at the first bending portion 211 and the second bending portion 212 provided at predetermined positions in the longitudinal direction (the X-axis direction in FIG. 14). The display 200 is sectioned into a first display portion 200a, a second display portion 200b, and a third display portion 200c that are virtually split by the first bending portion 211 and the second bending portion 212.

A bendable range of the display 200 will be described with reference to FIG. 15. FIG. 15 is an appearance view of the display 200 in the unfolded state when seen from the top surface. A rotation angle when the first holding member 202 and the second holding member 203 relatively rotate about the axis of the first hinge portion 96 will be referred to as θ1. The angular range of θ1 is as follows.

$$0° \leq \theta 1 \leq 180°$$

The state in which θ1 is 180° is a state in which the first holding member 202 and the second holding member 203 are adjacent to each other in a direction parallel to the X-axis direction in the drawing. It is possible to transition from the state in which θ1 is 180° to a state of 0° in which the first holding member 202 and the second holding member 203 rotate about the axis of the first hinge portion 96 in the counterclockwise direction and overlap each other in the Z-axis direction in the drawing.

A state in which θ1 is 180° is a state in which the first display portion 200a and the second display portion 200b are adjacent to each other in a direction parallel to the X-axis direction in the drawing. The display 200 is bent at the first bending portion 211 as a start point when the second holding member 203 rotates in the counterclockwise direction about the axis of the first hinge portion 96 relative to the first holding member 202. Also, in a state in which θ1 is 0°, the first display portion 200a and the second display portion 200b overlap each other face-to-face in the Z-axis direction in the drawing.

Next, a rotation angle when the second holding member 203 and the third holding member 204 relatively rotate about the axis of the second hinge portion 97 will be referred to as θ2. The angular range of θ2 is as follows.

$$180° \leq \theta 2 \leq 360°$$

The state in which θ2 is 180° is a state in which the second holding member 203 and the third holding member 204 are adjacent to each other in the direction parallel to the X-axis direction in the drawing. It is possible to perform rotation about the axis of the second hinge portion 97 in the clockwise direction from the state in which θ2 is 180° and to transition to a state of 360° in which the second holding member 203 and the third holding member 204 overlap each other in the Z-axis direction in the drawing.

In the state in which θ2 is 180°, the second holding member 203 and the third holding member 204 are in an adjacent state in a direction parallel to the X-axis direction in the drawing. When the third holding member 204 rotates in the clockwise direction about the axis of the second hinge portion 97 relative to the second holding member 203, the display 200 is bent at the second bending portion 212 as a start point. Also, in a state in which θ2 is 360°, the second display portion 200b and the third display portion 200c overlap each other back-to-back in the Z-axis direction in the drawing.

As described above, the configuration in which the rotation angle θ1 when the first holding member 202 and the second holding member 203 relatively rotate about the axis of the first hinge portion 96 is a rotatable range of 180° to 0° is employed. Also, the configuration in which the rotation angle θ2 when the second holding member 203 and the third holding member 204 relatively rotate about the axis of the second hinge portion 97 is a rotatable range of 180° to 360° is employed. In other words, the configuration deformable into the state in which the display 200 is bent and accommodated (the state in FIG. 13B) and the unfolded state (the state in FIG. 14) is employed.

In the accommodated state, the third display portion 200c is an exposed at a position adjacent to the grip portion 120, the selection button 114, and the setting button 115. In the unfolded state, the first display portion 200a is in an exposed state at a position adjacent to the grip portion 120, the selection button 114, and the setting button 115. Moreover, the second display portion 200b and the third display portion 200c can be unfolded in a direction away (the positive direction of the X axis in the drawing; the left direction) from the grip portion 120, the selection button 114, and the setting button 115. In other words, the second display portion 200b and the third display portion 200c are in an exposed state on the same plane as the first display portion 200a.

With the aforementioned configuration, the user can deform the display 200 into the accommodated state or the unfolded state while gripping the grip portion 120, and satisfactory gripping properties can thus be achieved. Since operations of the selection button 114 and the setting button 115 are not disturbed at this time, satisfactory operability can be achieved.

Next, a configuration of the main body coupling member 98 will be described with reference to FIGS. 16A and 16B. FIG. 16A is an appearance view of the display 200 when seen from the rear side in a state in which the display 200 has been caused to transition to a position on the upper side (the positive direction of the Y axis in the drawing) relative to the main body portion 100. FIG. 16B is a sectional view illustrating the main body coupling member 98 along B-B in FIG. 16A.

The main body coupling member 98 includes a display-side hinge portion 98a, a main body-side hinge portion 98b, and a coupling member 98c. The display-side hinge portion 98a is configured with a plate spring (not illustrated) and a shaft (not illustrated) at the first holding member 202. The main body-side hinge portion 98b is configured with a plate spring (not illustrated) and a shaft (not illustrated) at the main body portion 100. The coupling member 98c is formed of a sheet metal material or the like and connects each of axial centers of the display-side hinge portion 98a and the main body-side hinge portion 98b. In the present embodiment, a so-called biaxial hinge configuration is employed.

As illustrated in FIGS. 16A and 16B, the display 200 is configured to be rotatable about the X axis in the drawing, at each axial centers of the display-side hinge portion 98a and the main body-side hinge portion 98b relative to the main body portion 100. Moreover, a configuration in which the display 200 can be transition to the position on the upper side (the positive direction of the Y axis in the drawing) relative to the main body portion 100 is employed. The display 200 can be located further outward than the outer shape of the main body portion 100 in response to rotation of the main body coupling member 98.

It is possible to employ the same configuration as that of the second hinge portion 97 for the display-side hinge portion 98a and the main body-side hinge portion 98b. It is thus possible to hold the relative positions of the display 200 and the main body portion 100 at desired positions.

An angle detection switch 410 is provided near the main body coupling member 98 of the main body portion 100 and is configured with an electronic switch of a substrate mounting type. A configuration in which the relative position of the display 200 with respect to the main body portion 100 can be detected by the coupling member 98c rotating about the X axis in the drawing about the axis of the main body-side hinge portion 98b and by a lever, which is not illustrated, of the angle detection switch 410 being pressed thereinto is employed.

Figure 17:
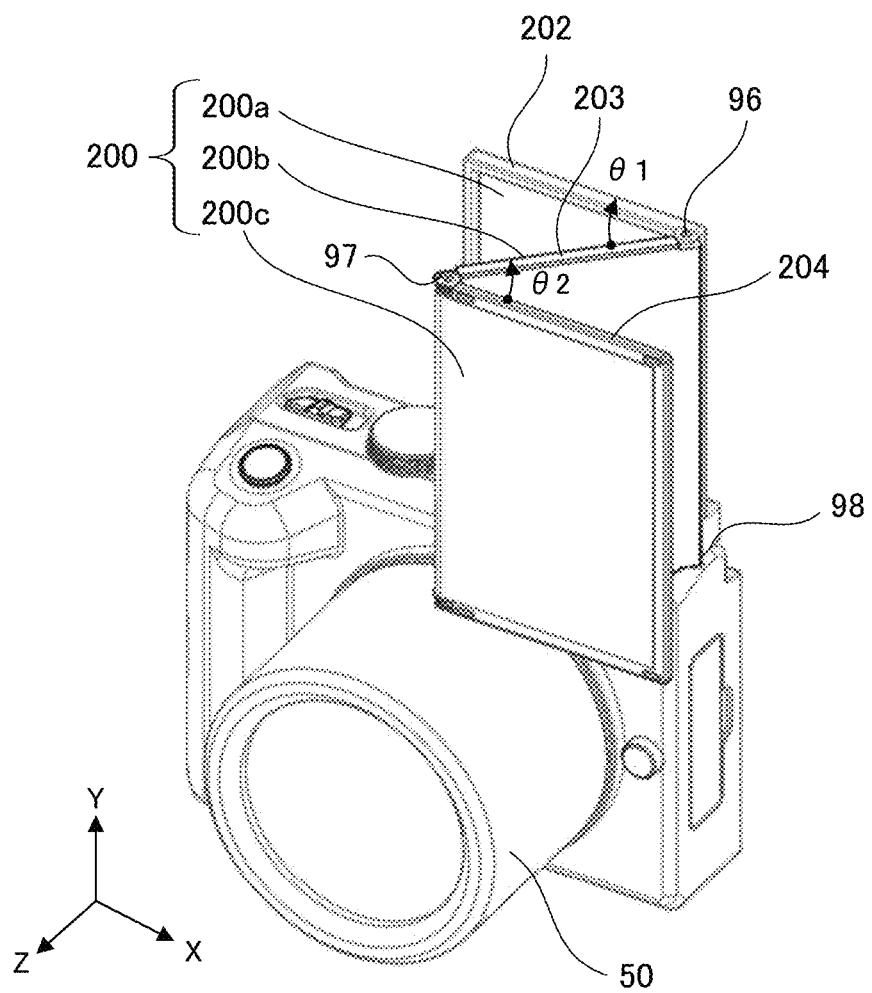
FIG. 17 is an appearance perspective view in a state in which the display has transitioned to a position near a lens unit according to the fourth embodiment.

A preferred posture for self-shooting will be described with reference to FIG. 17. FIG. 17 is an appearance perspective view illustrating a state in which the display 200 has been caused to transition to a position near the lens unit 50. The display 200 has transitioned to a position on the upper side (the positive direction of the Y axis in the drawing) of the main body portion 100. A relative angle θ1 between the first holding member 202 and the second holding member 203 is about 45°. A relative angle θ2 between the second holding member 203 and the third holding member 204 is about 315°.

In the state of FIG. 15, the first holding member 202, the second holding member 203, and the third holding member 204 are configured to be relatively rotatable without interference with the main body portion 100. At this time, the third display portion 200c faces the side of the object. Therefore, the user who is the object can perform imaging while checking the image to be captured and his/her facial expression at the time of self-shooting or the like, and satisfactory usability is thus achieved.

In the present embodiment, a configuration in which the third display portion 200c can transition in the Z-axis direction in the drawing at a location further forward (the positive direction of the Z axis in the drawing) than the main body portion 100 and near the lens unit 50. In this manner, a part of the third display portion 200c is not blocked by the lens unit 50, and satisfactory image viewability is achieved when the object performs self-shooting while viewing the third display portion 200c. Moreover, unnatural separation of the eye level of the object from the lens unit 50 does not occur when the object performs self-shooting while viewing the third display portion 200c, and it is thus possible to obtain a satisfactory imaging result.

Figure 18A:
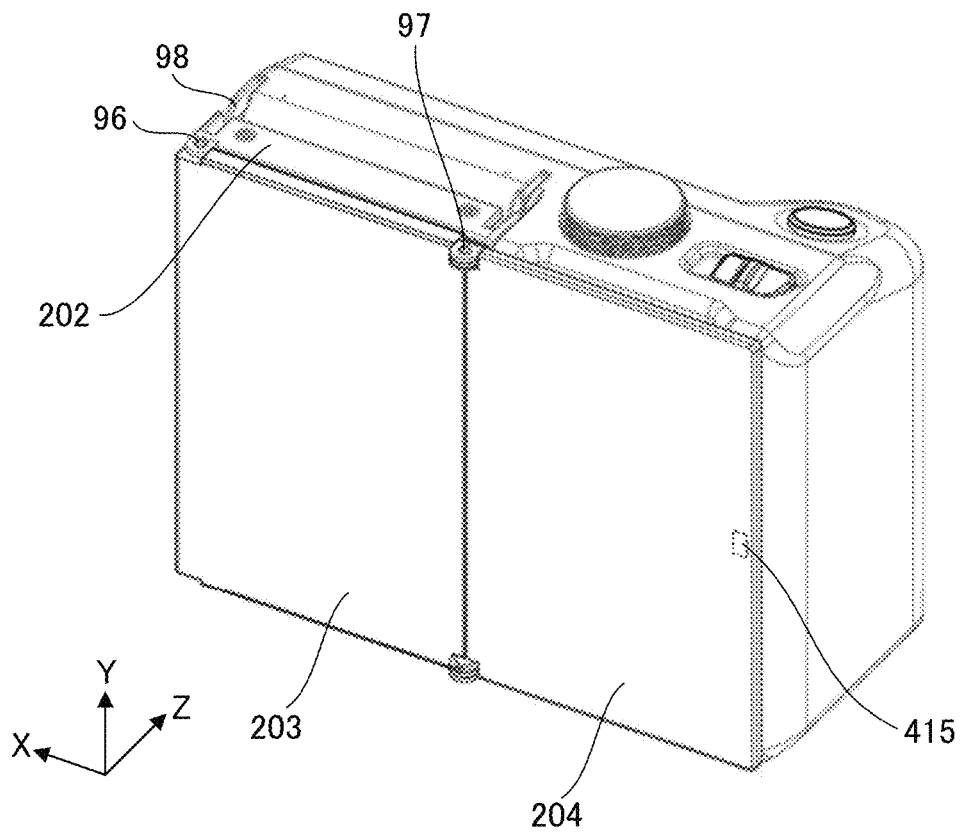
FIGS. 18A and 18B are appearance perspective views in a state in which the display is partially unfolded according to the fourth embodiment.
Figure 18B:
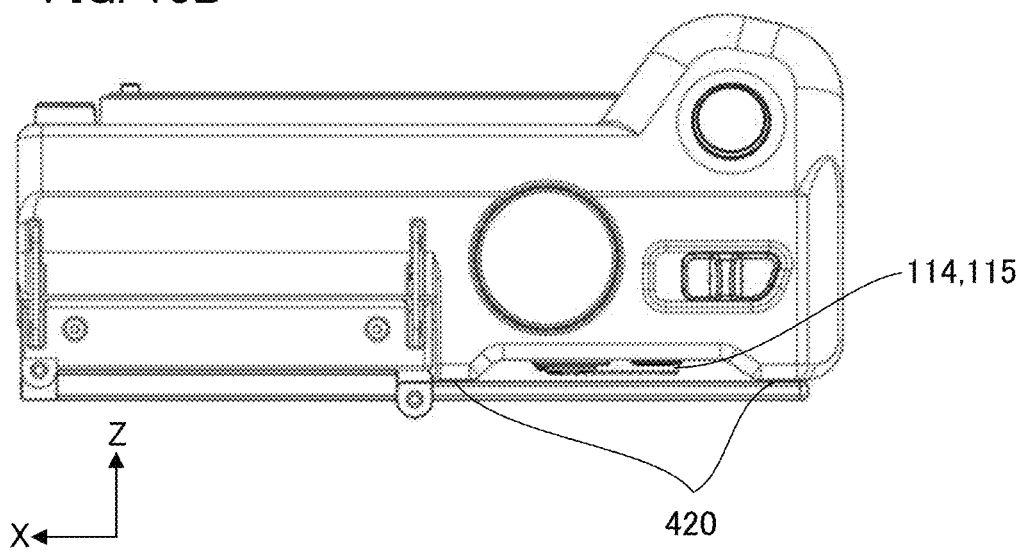

Protection of the display 200 will be described with reference to FIGS. 18A and 18B. FIG. 18A is an appearance perspective view of a state in which a part of the display 200 is unfolded. FIG. 18B is an appearance view in the state in FIG. 18A when seen from the top surface. A relative angle θ1 between the first holding member 202 and the second holding member 203 is 0°. A relative angle θ2 between the second holding member 203 and the third holding member 204 is 180°. The protected state of the display 200 is a state in which the third holding member 204 and the third display portion 200c are unfolded in the direction (the negative direction of the X axis in the drawing) of the grip portion 120.

A closure detection switch 415 has a configuration including a magnet, which is not illustrated, provided at the third holding member 204 and including a substrate mounting-type Hall element, which is not illustrated, provided at a position of the main body portion 100 corresponding to the magnet, which is not illustrated. The closure detection switch 415 detects a voltage due to a change in magnetic field in accordance with proximation and separation of the magnet. This provides a configuration in which the protected state can be detected.

The abutting portion 420 is a part provided at the main body portion 100 and formed by causing a part of the main body portion 100 to project into a projecting shape. The abutting portion 420 abuts on a part of the third holding member 204 in the protected state. The projecting amount of the abutting portion 420 from the main body portion 100 is larger than the projecting amounts of the selection button 114 and the setting button 115 from the main body portion 100. In other words, a configuration in which the third holding member 204 and the third display portion 200c abut on each other at a position where they do not interfere with the selection button 114 and the setting button 115 is employed.

It is desirable that the projecting amount of the abutting portion 420 from the main body portion 100 be set such that the second holding member 203 and the third holding member 204 are on the same plane in the protected state. Also, it is desirable that the outer shape of the main body portion 100 be set such that the first holding member 202 does not stick out of the main body portion 100 in the negative direction of the X axis in the drawing in the protected state. Moreover, the abutting portion 420 may also serves as the grip portion 120.

In the present embodiment, a configuration in which the selection button 114 and the setting button 115 are covered with and hidden by the third holding member 204 when the third holding member 204 and the third display portion 200c of the display 200 are unfolded in the direction (the negative direction of the X axis in the drawing) of the grip portion 120 is employed in the present embodiment. It is thus possible to prevent erroneous operations.

Also, a configuration in which the first display portion 200a, the second display portion 200b, and the third display portion 200c are not exposed when the third holding member 204 and the third display portion 200c of the display 200 are unfolded in the direction (the negative direction of the X axis in the drawing) of the grip portion 120 is employed. It is thus possible to avoid a risk that the display portions are erroneously damaged at the time of carrying.

Figure 19A:
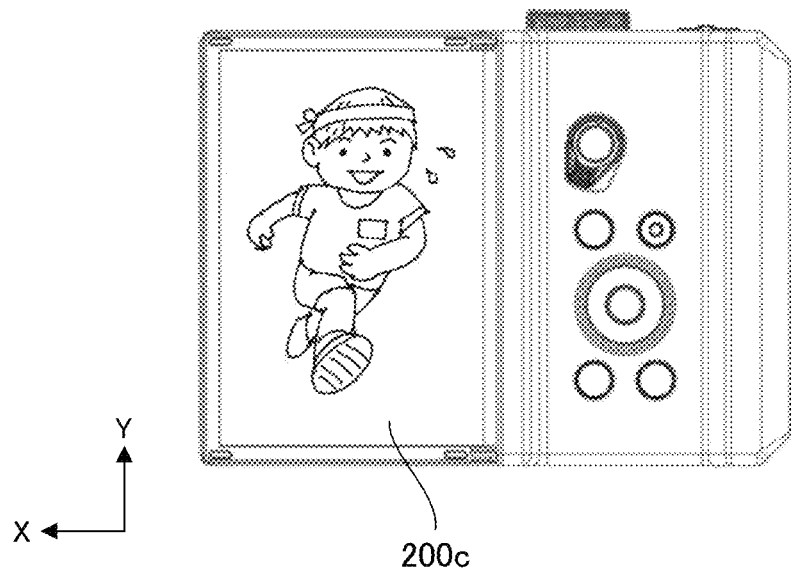
FIGS. 19A and 19B are diagrams illustrating an image display example according to the fourth embodiment.
Figure 19B:
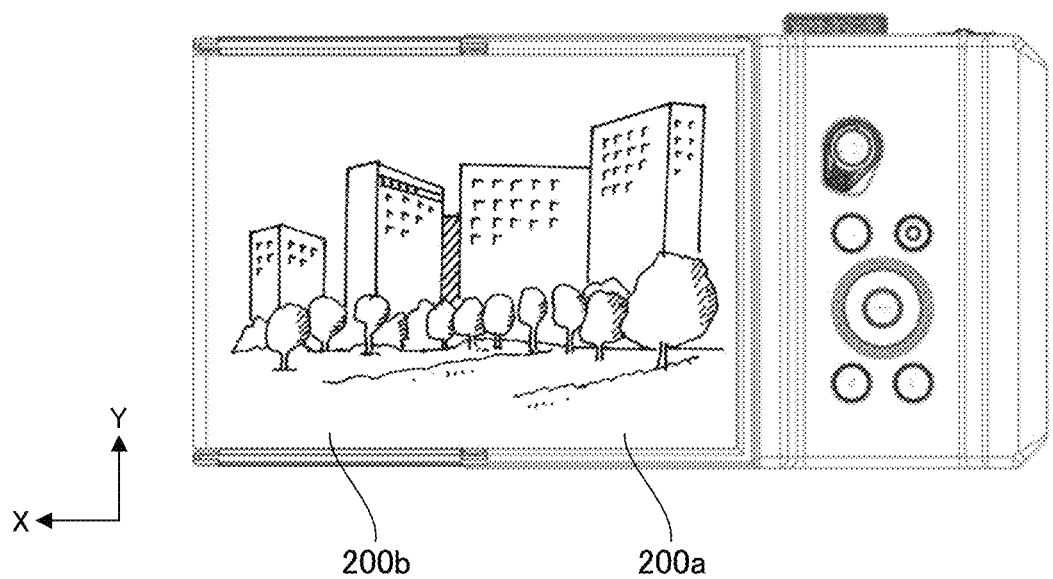

Next, an image display region will be described with reference to FIGS. 19A and 19B. FIG. 19A is a diagram illustrating an example in which an image is displayed on the third display portion 200c. FIG. 19B is a diagram illustrating an example in which images are displayed on the first display portion 200a and the second display portion 200b.

In FIG. 19A, a relative angle θ1 between the first holding member 202 and the second holding member 203 is 0°. A relative angle θ2 between the second holding member 203 and the third holding member 204 is 360°. A configuration in which the third display portion 200c is exposed to the side of the person who captures the image and the image can be displayed at this time is employed. In the present embodiment, an aspect ratio that is a size ratio between the long side (the side in the Y-axis direction in the drawing) of the third display portion 200c and the short side (the side in the X-axis direction in the drawing) is about 2:1 with the longitudinal direction corresponding to the long side (the Y-axis direction in the drawing). Therefore, the state in FIG. 19A is suitable for display of an image captured in the portrait format.

In FIG. 19B, the relative angle θ1 between the first holding member 202 and the second holding member 203 is 180°. The relative angle θ2 between the second holding member 203 and the third holding member 204 is 360°. A configuration in which the first display portion 200a and the second display portion 200b are exposed to the side of the person who captures the image and an image can be displayed in an integrated manner on the first display portion 200a and the second display portion 200b at this time is employed. In the present embodiment, an aspect ratio that is a size ratio between the total long side (the side in the X-axis direction in the drawing) of the display region including the first display portion 200a and the second display portion 200b and the short side (the side in the Y-axis direction in the drawing) is about 2:1 with the lateral direction corresponding to the long side (the X-axis direction in the drawing). Therefore, the state in FIG. 19B is suitable for display of an image captured in a landscape format. Also, in a case in which the image displayed in the state of FIG. 19A is caused to rotate by 90° and the image is displayed in an integrated manner on the first display portion 200a and the second display portion 200b illustrated in FIG. 19B, enlarged display with the same aspect ratio can be performed.

As described above, a configuration in which substantially the same aspect ratios of the display region are achieved in the accommodated state and the state in which a part of the display 200 is unfolded and the display region is enlarged is employed. It is thus possible to provide a display region that is optimal for the image to be displayed. Also, since enlarged display at the same aspect ratio can be performed, and satisfactory image viewability can be achieved.

In the present embodiment, the aspect ratio of the third display portion 200c and the aspect ratio of the region including the first display portion 200a and the second display portion 200b is set to about $\sqrt{2}:1$. This is suitable for display of images with typical A-series sizes. The aspect ratio of the third display portion 200c and the aspect ratio of the region including the first display portion 200a and the second display portion 200b, which are about $\sqrt{2}:1$. may be set to 3:2, which is an aspect ratio of typical photos. Specifically, in a case in which the sizes of the first display portion 200a, the second display portion 200b, and the third display portion 200c in the longitudinal direction (the Y-axis direction in the drawing) are the same, the sizes in the lateral direction (the X-axis direction in the drawing) are set as follows. The size of the first display portion 200a in the lateral direction (the X-axis direction in the drawing) is set to ⅔ of the size thereof in the longitudinal direction (the Y-axis direction in the drawing). The size of the display region including the second display portion 200b and the third display portion 200c in the lateral direction (the X-axis direction in the drawing) is set to be 3/2 of the size thereof in the longitudinal direction (the Y-axis direction in the drawing). In this manner, a configuration suitable for display of typical photos is obtained.

Fifth Embodiment

Figure 20A:
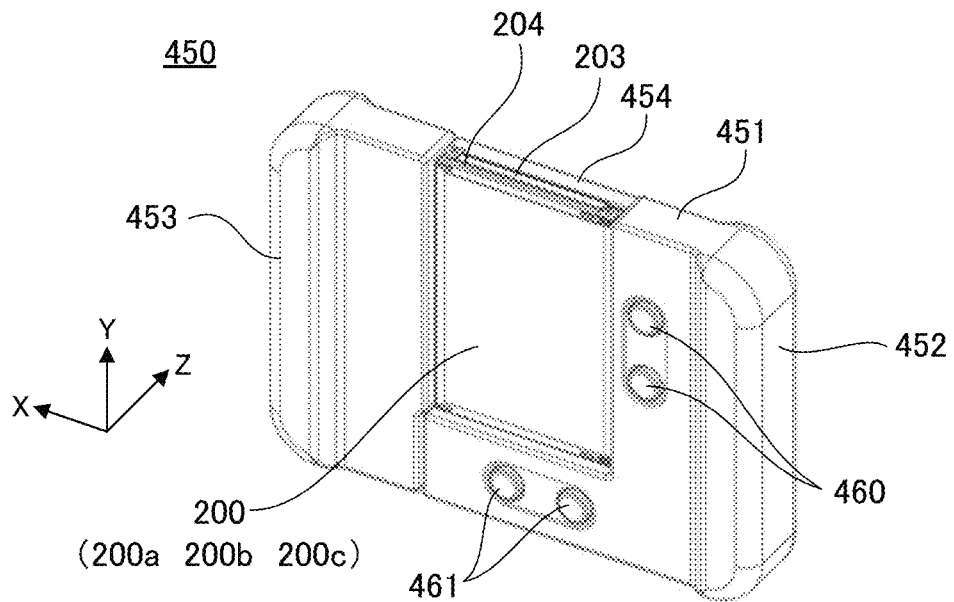
FIGS. 20A and 20B are diagrams illustrating an electronic apparatus according to a fifth embodiment.
Figure 20B:
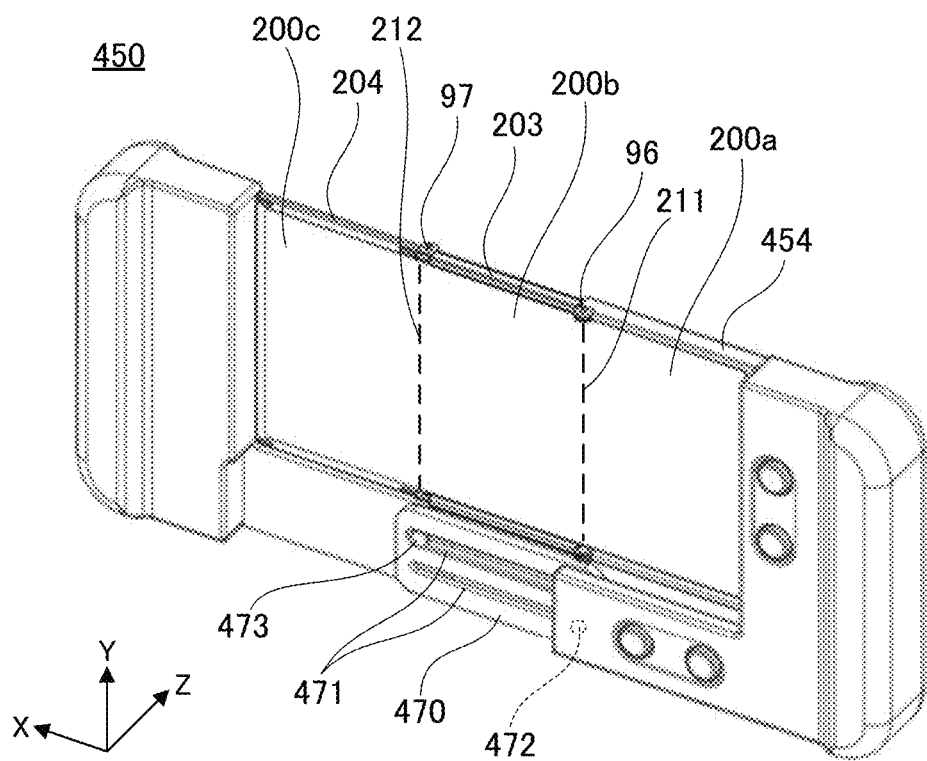

A mobile information terminal according to a fifth embodiment of the present invention will be described with reference to FIGS. 20A and 20B. FIG. 20A is an appearance perspective view of the mobile information terminal and illustrates a display accommodated state. FIG. 20B is an appearance perspective view of the mobile information terminal and illustrates a display unfolded state. A direction that perpendicularly intersects the display surface of the display is defined as a Z-axis direction, and an X-axis direction and a Y-axis direction that perpendicularly intersect the Z-axis direction are defined. The X-axis direction corresponds to the left-right direction, and the Y-axis direction corresponds to the up-down direction when the user views the display surface of the display.

A mobile information terminal 450 is a so-called personal digital assistant (PDA) and has a function of recording information such as schedules, addresses, and memos. The mobile information terminal 450 includes a main body portion 451 that is a case. The mobile information terminal 450 includes a right-side grip portion 452 and a left-side grip portion 453, both of which are parts at which the user holds the mobile information terminal 450. The right-side grip portion 452 is provided at a right end of the mobile information terminal 450 while the left-side grip portion 453 is provided at a left end of the mobile information terminal 450.

The display 200 is provided between a part including the main body portion 451 and the right-side grip portion 452 and the left-side grip portion 453. The display 200 has a configuration that can be unfolded in the direction (the positive direction of the X axis in the drawing) of the left-side grip portion 453. Since the configuration of the display 200 is the same as that in the first embodiment, description thereof will be omitted. The main body portion 451, the right-side grip portion 452, and the left-side grip portion 453 are formed to surround the display 200 in a substantially U shape when seen from the Z-axis direction.

The holding member 454 is formed integrally with the main body portion 451 and holds the position of the display 200 corresponding to the first display portion 200a. Although the holding member 454 is configured to be formed integrally with the main body portion 451 in the present embodiment, these components may be separate components, and a configuration in which the display 200 can be attached to and detached from the main body portion 451 may be employed. For example, there is a configuration in which a magnet or the like is provided at each of the main body portion 451 and the holding member 454 for obtaining magnetic securing at a predetermined position.

A first operation button 460 is provided at a position of the display 200 of the main body portion 451 on the side of the right-side grip portion 452. A second operation button 461 is provided at a position of the display 200 of the main body portion 451 on the side of the lower side. The user can perform various operations on the mobile information terminal 450 using the first and second operation buttons 460 and 461.

A slider 470 is formed through pressing of a plate metal material or molding of a resin material. The slider 470 has a configuration in which the main body portion 451 and the right-side grip portion 452 and the left-side grip portion 453 can be caused to relatively slide in the lateral direction (the X-axis direction in the drawing). A plurality of slide grooves 471 having substantially straight line shapes in the lateral direction (the X-axis direction in the drawing) and penetrating in the thickness direction (the Z-axis direction in the drawing) are formed in the slider 470.

A right-side slide pin 472 is a substantially columnar-shaped part formed at the main body portion 451 and inserted in the slide groove 471. A left-side slide pin 473 is a substantially columnar-shaped part formed at the left-side grip portion 453 and inserted into the slide groove 471.

The mobile information terminal 450 has a configuration that is deformable in accordance with the accommodated state in which the display 200 is bent and the unfolded state.

In other words, a deformation section is realized by the slider 470, the slide grooves 471, the right-side slide pin 472, and the left-side slide pin 473.

In the present embodiment, a configuration in which the right-side grip portion 452 and the left-side grip portion 453 are provided at both ends of the mobile information terminal 450 and the display 200 is provided therebetween is employed. Also, deformation into the state in which the display 200 is bent and accommodated between the right-side grip portion 452 and the left-side grip portion 453 and the unfolded state can be achieved. Moreover, a configuration in which the display 200 can be unfolded in the direction (the positive direction of the X axis in the drawing) of the left-side grip portion 453 is employed. In other words, a configuration in which the first to third display portions can be exposed at positions in a space on a plane surrounded by the plurality of grip portions when seen in the Z-axis direction is employed.

According to the present embodiment, the user can firmly grip the mobile information terminal 450, and satisfactory gripping properties can be achieved. Also, since the right-side grip portion 452, the left-side grip portion 453, the first operation button 460, and the second operation button 461 are not hidden even in the unfolded state of the display 200, satisfactory operability is achieved when the mobile information terminal 450 is used.

Other Embodiments

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-025382 filed on Feb. 19, 2021, which is hereby incorporated by reference herein in its entirety.

What is claimed is:

1. An electronic apparatus comprising:
a display that at least partially has flexibility; and
a main body portion,
wherein the display includes a plurality of display portions, has a bending portion at each of boundaries of the plurality of display portions, and is configured to be bendable at the bending portion as a start point in response to rotation of a hinge portion that is relatively rotatably coupled to first and second display portions among the plurality of display portions,
the main body portion includes a grip portion and an operation portion disposed at the grip portion,
a coupling portion that rotatably couples the display to the main body portion is included, and
the display is located at a position that is different from the grip portion inside an outer shape of the main body portion in an accommodated state, and the first and second display portions are unfolded to be parallel to each other in an unfolded state,
wherein the display includes first to third display portions, a first bending portion being included at a boundary between the first display portion and the second display portion, and a second bending portion being included at a boundary between the second display portion and the third display portion,
wherein the electronic apparatus includes: a first hinge portion that is relatively rotatably coupled to the first display portion and the second display portion so as to correspond to the first bending portion, and a second hinge portion that is relatively rotatably coupled to the second display portion and the third display portion so as to correspond to the second bending portion, and the display is able to be bent at the first and second bending portions as start points in response to rotation of the first and second hinge portions, wherein a thickness of a holding member of the first display portion is equal to a thickness of a holding member of the second display portion, and a distance from a surface on which the holding member of the first display portion is secured to the main body portion to a surface to which the operation portion is secured is equal to or greater than a sum of a height of the operation portion from the main body portion and the thickness of the holding member of the second display portion, and wherein the main body portion includes a thumb rest with a thickness that is greater than the height of the operation portion, and the thickness of the thumb rest is equal to or less than a length obtained by subtracting a thickness of the holding member of the third display portion from the distance.

2. The electronic apparatus according to claim 1, wherein the display is able to transition to the accommodated state or the unfolded state through relative rotation of the first display portion, the second display portion, and the third display portion, the third display portion is not exposed in the accommodated state, and the first display portion is exposed and the third display portion is able to be unfolded in a direction away from the grip portion in the unfolded state.

3. The electronic apparatus according to claim 1, wherein a rotation axis of the coupling portion and rotation axes of the first bending portion and the second bending portion are parallel to each other, and the coupling portion is disposed at the main body portion on a side opposite to a side on which the operation portion is disposed, with respect to a substantial center of the electronic apparatus.

4. The electronic apparatus according to claim 1, wherein the coupling portion is able to be bent within a range of 180°, the first bending portion is able to be bent within a range of 180° to 360°, which allows the display to be folded on a first side, and the second bending portion is able to be bent within a range of 0° to 360°, which allows the display to be folded on the first side and a second side that is opposite to the first side.

5. The electronic apparatus according to claim 1, further comprising:

a battery chamber provided in the main body portion corresponding to the first display portion.

6. The electronic apparatus according to claim 1, wherein three or more bending portions are provided in the display.

7. The electronic apparatus according to claim 1, wherein a thickness of a holding member of the first display portion is equal to a sum of a thickness of a holding member of the second display portion and a thickness of a holding member of the third display portion.

8. The electronic apparatus according to claim 1, further comprising:

an imaging section.

9. An electronic apparatus comprising:

a display that at least partially has flexibility; and a main body portion, wherein the display includes a plurality of display portions, has a bending portion at each of boundaries of the plurality of display portions, and is configured to be bendable at the bending portion as a start point in response to rotation of a hinge portion that is relatively rotatably coupled to first and second display portions among the plurality of display portions, the main body portion includes a grip portion and an operation portion disposed at the grip portion, a coupling portion that rotatably couples the display to the main body portion is included, and the display is located at a position that is different from the grip portion inside an outer shape of the main body portion in an accommodated state, and the first and second display portions are unfolded to be parallel to each other in an unfolded state, wherein the display includes first to third display portions, a first bending portion being included at a boundary between the first display portion and the second display portion, and a second bending portion being included at a boundary between the second display portion and the third display portion, wherein the electronic apparatus includes: a first hinge portion that is relatively rotatably coupled to the first display portion and the second display portion so as to correspond to the first bending portion, and a second hinge portion that is relatively rotatably coupled to the second display portion and the third display portion so as to correspond to the second bending portion, and the display is able to be bent at the first and second bending portions as start points in response to rotation of the first and second hinge portions, wherein a side of a holding member of the third display portion facing the second hinge portion is configured with a member that partially or entirely has elasticity, wherein the electronic apparatus further comprises a recessed portion provided on the side facing the second hinge portion, and wherein the second display portion includes an operation region at a position facing the recessed portion in the accommodated state.

10. The electronic apparatus according to claim 9, further comprising:

planar portions extending from both ends of the recessed portion.

11. The electronic apparatus according to claim 9, further comprising:

a lens unit, wherein the recessed portion has a shape along an outer shape of the lens unit.

12. An electronic apparatus comprising:

a display that at least partially has flexibility; and a main body portion, wherein:

the display includes a plurality of display portions, has a bending portion at each of boundaries of the plurality of display portions, and is configured to be bendable at the bending portion as a start point in response to rotation of a hinge portion that is relatively rotatably coupled to first and second display portions and a hinge portion that is relatively rotatably coupled to second and third display portions, among the plurality of display portions, the main body portion includes a grip portion at least at one end, the display is located at a position that is different from the grip portion inside an outer shape of the main body portion in an accommodated state, and the first and second display portions are unfolded to be parallel to each other in an unfolded state, the electronic apparatus further comprises an operation portion provided near the grip portion, wherein the display does not overlap the operation portion in the accommodated state and the unfolded state, the third display portion is unfolded in a direction of the grip portion from the accommodated state, and transition into a protected state in which the third display portion overlaps the grip portion and the operation portion and the first to third display portions are not exposed is able to be achieved, and in the protected state, a part of the third display portion abuts on an abutting portion provided at the main body portion, and the third display portion and the second display portion are unfolded to be parallel to each other.

13. The electronic apparatus according to claim 12, wherein the display includes first to third display portions, a first bending portion is included at a boundary between the first display portion and the second display portion, a second bending portion is included at a boundary between the second display portion and the third display portion, the electronic apparatus includes a first hinge portion that is relatively rotatably coupled to the first display portion and the second display portion so as to correspond to the first bending portion, and a second hinge portion that is relatively rotatably coupled to the second display portion and the third display portion so as to correspond to the second bending portion, and the display is able to be bent at the first and second bending portions as start points in response to rotation of the first and second hinge portions.

14. The electronic apparatus according to claim 13, wherein the display is able to transition to the accommodated state or the unfolded state through relative rotation of the first display portion, the second display portion, and the third display portion, the third display portion is exposed in the accommodated state, and the first display portion is exposed and the third display portion is able to be unfolded in a direction away from the grip portion in the unfolded state.

15. The electronic apparatus according to claim 13, further comprising:

a coupling member that relatively rotatably couples the main body portion and the display at least at one end of the main body portion, wherein the coupling member rotates in a direction that perpendicularly intersects a direction of rotation axes of the first and second hinge portions, and the display is located further outward than the outer shape of the main body portion.

16. The electronic apparatus according to claim 12, wherein an aspect ratio of any of the first to third display portion is substantially the same as an aspect ratio of a display portion including two adjacent display portions from among the first to third display portions.

17. The electronic apparatus according to claim 12, wherein the main body portion includes a plurality of grip portions on different sides, the third display portion is exposed at a position that is adjacent to the plurality of grip portions in the accommodated state, and the first to third display portions are exposed at positions within a space surrounded by the plurality of grip portions in the unfolded state.

18. The electronic apparatus according to claim 17, further comprising:

a deformation section that causes an outer shape of the main body portion or the grip portion to be deformed in a direction in which the display is unfolded in a case of transition from the accommodated state to the unfolded state.

* * * * *